(12) United States Patent
Abe et al.

(10) Patent No.: US 6,710,716 B1
(45) Date of Patent: Mar. 23, 2004

(54) POWER DETECTING CIRCUIT AND DEMODULATOR COMPRISING THE SAME

(75) Inventors: Masayoshi Abe, Tokyo (JP); Noboru Sasho, Kanagawa (JP); Dragan Krupezevic, Stuttgart (DE); Veselin Brankovic, Fellbach (DE)

(73) Assignees: Sony Corporation (JP); Sony International (Europe) G.m.b.H. (JP)

( * ) Notice: Subject to any disclaimer, the term of this patent is extended or adjusted under 35 U.S.C. 154(b) by 53 days.

(21) Appl. No.: 10/048,538

(22) PCT Filed: May 31, 2000

(86) PCT No.: PCT/JP00/03521
§ 371 (c)(1),
(2), (4) Date: Jan. 31, 2002

(87) PCT Pub. No.: WO01/93416
PCT Pub. Date: Dec. 6, 2001

(51) Int. Cl.[7] .............................................. G08B 21/00
(52) U.S. Cl. ..................... 340/635; 330/277; 324/769
(58) Field of Search ........................... 340/635, 636.15, 340/652, 870.16, 870.18; 330/279, 140, 285, 330, 277; 455/126, 127; 365/191, 198; 324/769, 765

(56) References Cited

U.S. PATENT DOCUMENTS 5,386,109 A * 1/1995 Ikeuchi et al. .......... 250/214 R
5,724,005 A * 3/1998 Chen et al. .................. 330/279
6,417,776 B1 * 7/2002 Tagishi ........................ 340/635
6,448,855 B1 * 9/2002 Sowlati ........................ 330/279

FOREIGN PATENT DOCUMENTS

| JP | 53-38961 | 4/1978 |
| JP | 54-79551 | 6/1979 |
| JP | 61-230410 | 10/1986 |
| JP | 61-237504 | 10/1986 |
| JP | 61-295701 | 12/1986 |
| JP | 8-125445 | 5/1996 |

* cited by examiner

Primary Examiner—Anh V La
(74) Attorney, Agent, or Firm—Rader, Fishman & Grauer PLLC; Ronald P. Kananen

(57) ABSTRACT

A high performance power detector not only suited for monolithic structures, small in size, low in cost, and suitabed for broadband high frequency operations, but also excellent in the linearity of the detection characteristic, having a small fluctuation of detection characteristic relative to the bias fluctuation, having a small fluctuation of detection characteristic relative to the FET threshold voltage fluctuation, and in addition having a small DC offset wherein an additional circuit is unnecessary even if the latter stage circuit has a balance input, and a demodulator using the same.

20 Claims, 19 Drawing Sheets

POWER DETECTING CIRCUIT AND DEMODULATOR COMPRISING THE SAME

TECHNICAL FIELD

The present invention relates to a power detector used in a communication apparatus for transmitting and receiving high frequency signals, or a measurement device for measuring signal levels of high frequency signals, and a demodulator using the same.

BACKGROUND ART

In a conventional high frequency power detector, a Schottky barrier diode has often been mainly used.

FIG. 1 is circuit diagram of an example of the configuration of a conventional high frequency power detector using the diode.

As shown in FIG. 1, this high frequency power detector 1 is comprised of a diode D1 as an active element, a DC bias resistor R1, a capacitor C1, and a load resistor RL1.

An anode of the diode D1 is connected to an input terminal Tin1 of a high frequency signal RFin and one end of the resistor R1, while a cathode thereof is connected to an output terminal Tout1, one electrode of the capacitor C1 for removing a high frequency component, and one end of the load resistor RL1. The other ends of the resistors R1 and RL1 and the other electrode of the capacitor C1 are grounded.

In the high frequency power detector 1 having such a configuration, the high frequency signal RFin is input to the input terminal Tin1. By a rectification function of the diode D1 and the capacitor C1 having a sufficiently large capacitance, an envelope component of the input high frequency signal is output as a detection output signal Vout.

In the high frequency power detector 1, it is required to linearly obtain the detection output voltage Vout from a signal level as low as possible to a signal level as high as possible, that is in a wide dynamic range.

FIG. 2 is a diagram of an example of characteristics of the high frequency power detector using a diode as an active element.

This example plotted the relationship of the output voltage Vout with respect to an input high frequency power Pin obtained when a Schottky barrier diode was used, a bias voltage Vd of the diode D1 in FIG. 1 was set at 0V (Vd=0V: zero bias), and the frequency of the high frequency signal was 10 GHz.

The conventional power detector using a Schottky barrier diode having such a characteristic has the following disadvantages.

In order to raise the detection performance, the circuit is produced by using a special semiconductor process. Accordingly, the conventional power detector is not suited for an integrated circuit.

For this reason, the conventional power detector has to have a hybrid configuration. This induces a rise of production costs, a restriction of the operation band, and an increase of production variability.

When the power detector is comprised by a semiconductor process enabling circuit integration, the detection characteristic thereof is deteriorated.

In recent years, there have been strong demands for reduction of size and lowering of price of mobile phones and other wireless communications devices. Circuit integration is important as a means for responding to such demands.

Therefore, in order to obtain a high performance, high frequency power detector suited for circuit integration, a power detector using a field effect transistor (FET) as an active element has been investigated (for example, the above document).

FIG. 3 is a circuit diagram of an example of the configuration of a conventional high frequency power detector using a silicon (Si) MOSFET.

As shown in FIG. 3, this high frequency power detector 2 is comprised of a field effect transistor (hereinafter, simply referred to as a "transistor") Q1, resistors R2 and R3, capacitors C2 and C3, a voltage source V1, and a load resistor RL2.

In this high frequency power detector 2, a gate of the transistor Q1 is biased by a bias supply circuit comprised of the voltage source V1, resistor R3, and the capacitor C2. The input high frequency signal RFin is propagated through the transistor Q1 having a predetermined resistance between the drain and the source, and an envelope component of the input high frequency signal is output as the detection output signal Vout by the capacitor C3 having a large capacitance on the output side.

However, the high frequency power detector of FIG. 3 has the following disadvantages.

Since it uses an SiMOSFET, the maximum operation frequency is low, i.e., the 1.5 GHz band.

Also, as shown in FIG. 4, there is room for improvement of linearity of the input power versus detection output voltage characteristic (Mohamed RATNI, Bernard HUYART, et al., "RF Power Detector using a Silicon MOSFET", International Microwave Symposium, 1998).

Also, in the power detector 2, where the output format is the single end system and the latter stage of the linear detector has a balance input, an additional unbalance/balance conversion circuit becomes necessary.

FIG. 5 is a circuit diagram of another example of the configuration of the high frequency power detector using a field effect transistor as an active element (refer to Japanese Unexamined Patent Publication (Kokai) No. 10-234474).

As shown in FIG. 5, this high frequency power detector 3 is comprised by a transistor (FET) Q2, a DC cutting capacitor Cin, a bias resistor R4, voltage sources V2 and V3, a load resistor RL3, an output side capacitor C4, a coupling capacitor Cd, and an inductor Ld. A gate bias supply circuit 3a is comprised by the resistor R4, while a drain bias supply circuit 3b is comprised by the inductor Ld.

In this high frequency power detector 3, the high frequency signal RFin input to an input terminal Tin3 is supplied via the DC cutting capacitor Cin to the gate of the transistor Q2. The gate of the transistor Q2 is supplied with the gate bias voltage of the gate bias supply circuit 3a connected to the voltage source V2 for supplying a voltage Vgg. Also, the drain of the transistor Q2 has connected to it the drain bias supply circuit 3b for supplying the drain bias voltage. Note that the voltage source V3 for supplying a DC voltage Vdd is connected to the drain bias supply circuit 3b.

A coupling capacitor Cd having a sufficiently large capacitance value is connected between the drain of the transistor Q2 and a ground potential GND. The resistor RL3 and the coupling capacitor C4 having a sufficiently large capacitance value are connected in parallel between the source of the transistor Q2 and the ground potential GND. Then, a potential difference Vout between the transistor Q2 and the ground potential GND becomes the detection output signal.

FIG. 6 shows the detection characteristics of the high frequency power detector of FIG. 5.

This power detector 3 enables the realization of a detector of a small size and low cost and adapted to broadband high frequency operation, but has the following disadvantages.

As shown in FIG. 6, the fluctuation of the detection output voltage versus input power characteristic is large compared with the gate-source bias fluctuation.

As shown in FIG. 6, depending on the bias conditions, sometimes a DC offset occurs.

When a pinchoff voltage of the transistor Q2 fluctuates due to a production variability, temperature fluctuation, etc., the fluctuation of the detection output voltage versus input voltage characteristic is large.

Also, in the power detector 3, when the output format is the single end system and the latter stage of the linear detector has a balance input, an additional unbalance/balance conversion circuit becomes necessary.

DISCLOSURE OF THE INVENTION

The present invention was made in consideration of such a circumstance and has as an object thereof to provide a high performance power detector not only suited for monolithic structures, small in size, low in cost, and suited for broadband high frequency operation, but also excellent in the linearity of the detection characteristic relative to the bias fluctuation, having a small fluctuation of the detection characteristic relative to the FET threshold voltage fluctuation, having a small DC offset, and not requiring an a additional circuit even when the latter stage circuit has a balance input, and a demodulator using the same.

A first aspect of the present invention is a power detector for detecting a signal level of a high frequency signal, having a first field effect transistor having a gate supplied with the high frequency signal, a second field effect transistor having a source connected to a source of the first field effect transistor, a first gate bias supply circuit for supplying a gate bias voltage to the gate of the first field effect transistor, a second gate bias supply circuit for supplying a gate bias voltage to the gate of the second field effect transistor, a resistor connected between a connecting point of sources of the first field effect transistor and second field effect transistor and a reference potential, a drain bias supply circuit for supplying the drain bias voltage to drains of the first field effect transistor and second field effect transistor, a first capacitor connected between the drain of the first field effect transistor and a reference potential, and a second capacitor connected between the drain of the second field effect transistor and a reference potential, wherein a voltage difference between the drain voltage of the first field effect transistor and the drain voltage of the second field effect transistor is defined as the detection output.

A second aspect of the present invention is a power detector for detecting a signal level of a high frequency signal, having a first field effect transistor having a gate supplied with the high frequency signal, a second field effect transistor having a source connected to a source of the first field effect transistor, a first gate bias supply circuit for supplying a gate bias voltage to the gate of the first field effect transistor, a second gate bias supply circuit for supplying a gate bias voltage to a gate of the second field effect transistor, a third field effect transistor connected between the connecting point of sources of the first field effect transistor and second field effect transistor and a reference potential, a third gate bias supply circuit for supplying the gate bias voltage to the gate of the third field effect transistor, a drain bias supply circuit for supplying the drain bias voltage to drains of the first field effect transistor and second field effect transistor, a first capacitor connected between the drain of the first field effect transistor and a reference potential, and a second capacitor connected between the drain of the second field effect transistor and a reference potential, wherein the voltage difference between the drain voltage of the first field effect transistor and the drain voltage of the second field effect transistor is defined as the detection output.

A third aspect of the present invention is a power detector for detecting a signal level of a high frequency signal, having a first field effect transistor having a gate supplied with the high frequency signal, a second field effect transistor having a source connected to a source of the first field effect transistor, a first gate bias supply circuit for supplying a gate bias voltage to the gate of the first field effect transistor, a second gate bias supply circuit for supplying a gate bias voltage to the gate of the second field effect transistor, a first resistor and a second resistor connected in series between the connecting point of sources of the first field effect transistor and second field effect transistor and a reference potential and having the related connecting point supplied with the high frequency signal, an inductor connected between the connecting point of the first resistor and second resistor and a reference potential, a drain bias supply circuit for supplying the drain bias voltage to drains of the first field effect transistor and second field effect transistor, a first capacitor connected between the drain of the first field effect transistor and a reference potential, and a second capacitor connected between the drain of the second field effect transistor and the reference potential, wherein the voltage difference between the drain voltage of the first field effect transistor and the drain voltage of the second field effect transistor is defined as the detection output.

Preferably, the first field effect transistor and second field effect transistor have substantially identical characteristics, the drain bias supply circuit includes a first drain bias resistor connected between the drain of the first field effect transistor and the voltage source and a second drain bias resistor connected between the drain of the second field effect transistor and the voltage source, a resistance value of the first drain bias resistor and the resistance value of the second drain bias resistor are set at substantially equal values, and a capacitance value of the first capacitor and the capacitance value of the second capacitor are set. at substantially equal values.

Also, preferably, a ratio Wga/Wgb of a gate width Wga of the first field effect transistor and a gate width Wgb of the second field effect transistor is set to N, the drain bias supply circuit includes the first drain bias resistor connected between the drain of the first field effect transistor and the voltage source and the second drain bias resistor connected between the drain of the second field effect transistor and the voltage source, the first gate bias voltage of the first gate bias supply circuit and the second gate bias voltage of the second gate bias supply circuit are set to substantially equal, a resistance value Ra of the first drain bias resistor and a resistance value Rb of the second drain bias resistor are set so as to satisfy a condition of Ra/Rb=1/N, and the capacitance value of the first capacitor and the capacitance value of the second capacitor are set to substantially equal values.

A fourth aspect of the present invention is a power detector for detecting a signal level of a high frequency signal, having a first field effect transistor having a gate supplied with the high frequency signal and a source connected to a reference potential, a second field effect transistor having a source connected to a reference potential, a first gate bias supply circuit for supplying a gate bias voltage to the gate of the first field effect transistor, a second gate bias supply circuit for supplying a gate bias voltage to a gate of the second field effect transistor, a drain bias supply circuit for supplying a drain bias voltage to drains of the first field effect transistor and second field effect transistor, a first capacitor connected between the drain of the first field effect transistor and a reference potential, and a second capacitor connected between the drain of the second field effect transistor and a reference potential, wherein the voltage difference between the drain voltage of the first field effect transistor and the drain voltage of the second field effect transistor is defined as the detection output.

Preferably, the first field effect transistor and second field effect transistor have substantially identical characteristics, the drain bias supply circuit includes a first drain bias resistor connected between the drain of the first field effect transistor and the voltage source and a second drain bias resistor connected between the drain of the second field effect transistor and the voltage source, the first gate bias voltage of the first gate bias supply circuit and the gate bias voltage of the second gate bias supply circuit are substantially equal and set to a voltage substantially equal to the threshold voltage of the first and second field effect transistors, the resistance value of the first drain bias resistor and the resistance value of the second drain bias resistor are set at substantially equal values, and the capacitance value of the first capacitor and the capacitance value of the second capacitor are set at substantially equal values.

Also, preferably, the ratio Wga/Wgb of the gate width Wga of the first field effect transistor and the gate width Wgb of the second field effect transistor is set to N, the drain bias supply circuit includes the first drain bias resistor connected between the drain of the first field effect transistor and the voltage source and the second drain bias resistor connected between the drain of the second field effect transistor and the voltage source, the first gate bias voltage of the first gate bias supply circuit and the second gate bias voltage of the second gate bias supply circuit are set to voltages which are substantially equal to each other and substantially equal to the threshold voltage of the first and second field effect transistors, the resistance value Ra of the first drain bias resistor and the resistance value Rb of the second drain bias resistor are set so as to satisfy the condition of Ra/Rb=1/N, and the capacitance value of the first capacitor and the capacitance value of the second capacitor are set to substantially equal values.

Also, a demodulator according to a fifth aspect of the present invention has a first signal input terminal to which a first high frequency signal is input, a second signal input terminal to which a second high frequency signal is input, a generating means for generating two high frequency signals having a phase difference based on at least one high frequency signal between the first high frequency signal input from the first signal input terminal and the second high frequency signal input from the second signal input terminal and including at least one output terminal for outputting generated high frequency signals, at least one power detector for receiving as the input the high frequency signals output from the output terminal of the generating means and detecting the signal level of the input high frequency signals, and a conversion circuit for converting the output signal of the power detector to a plurality of signal components contained in the first or second high frequency signal, wherein the power detector has a first field effect transistor having a gate supplied with the high frequency signal, a second field effect transistor having a source connected to a source of the first field effect transistor, a first gate bias supply circuit for supplying a gate bias voltage to the gate of the first field effect transistor, a second gate bias supply circuit for supplying a gate bias voltage to a gate of the second field effect transistor, a resistor connected between the connecting point of sources of the first field effect transistor and second field effect transistor and a reference potential, a drain bias supply circuit for supplying a drain bias voltage to drains of the first field effect transistor and second field effect transistor, a first capacitor connected between the drain of the first field effect transistor and a reference potential, and a second capacitor connected between the drain of the second field effect transistor and a reference potential, wherein the voltage difference between the drain voltage of the first field effect transistor and the drain voltage of the second field effect transistor is defined as the detection output.

A demodulator according to a sixth aspect of the present invention has a first signal input terminal to which a first high frequency signal is input, a second signal input terminal to which a second high frequency signal is input, a generating means for generating two high frequency signals having a phase difference based on at least one high frequency signal between the first high frequency signal input from the first signal input terminal and the second high frequency signal input from the second signal input terminal and including at least one output terminal for outputting the generated high frequency signals, at least one power detector for receiving as input the high frequency signals output from the output terminal of the generating means and detecting the signal level of the input high frequency signals, and a conversion circuit for converting the output signal of the power detector to a plurality of signal components contained in the first or second high frequency signal, wherein the power detector has a first field effect transistor having a gate supplied with the high frequency signal, a second field effect transistor having a source connected to a source of the first field effect transistor, a first gate bias supply circuit for supplying a gate bias voltage to the gate of the first field effect transistor, a second gate bias supply circuit for supplying a gate bias voltage to the gate of the second field effect transistor, a third field effect transistor connected between the connecting point of sources of the first field effect transistor and second field effect transistor and a reference potential, a third gate bias supply circuit for supplying a gate bias voltage to a gate of the third field effect transistor, a drain bias supply circuit for supplying a drain bias voltage to drains of the first field effect transistor and second electric field effect transistor, a first capacitor connected between the drain of the first field effect transistor and a reference potential, and a second capacitor connected between the drain of the second field effect transistor and a reference potential, wherein the voltage difference between the drain voltage of the first field effect transistor and the drain voltage of the second field effect transistor is defined as the detection output.

A demodulator according to a seventh aspect of the present invention has a first signal input terminal to which a first high frequency signal is input, a second signal input terminal to which a second high frequency signal is input, a generating means for generating two high frequency signals having a phase difference based on at least one high frequency signal between the first high frequency signal input from the first signal input terminal and the second high frequency signal input from the second signal input terminal and including at least one output terminal for outputting generated high frequency signals, at least one power detector for receiving as input the high frequency signals output from the output terminal of the generating means and detecting the signal level of the input high frequency signals, and a conversion circuit for converting the output signal of the power detector to a plurality of signal components contained in the first or second high frequency signal, wherein the power detector has a first field effect transistor having a gate supplied with the high frequency signal, a second field effect transistor having a source connected to a source of the first field effect transistor, a first gate bias supply circuit for supplying a gate bias voltage to the gate of the first field effect transistor, a second gate bias supply circuit for supplying a gate bias voltage to a gate of the second field effect transistor, a first resistor and a second resistor connected in series between the connecting point of sources of the first field effect transistor and second field effect transistor and a reference potential and having the related connecting point supplied with the high frequency signal, an inductor connected between the connecting point of the first resistor and second resistor and the reference potential, a drain bias supply circuit for supplying a drain bias voltage to drains of the first field effect transistor and second field effect transistor, a first capacitor connected between the drain of the first field effect transistor and a reference potential, and a second capacitor connected between the drain of the second field effect transistor and a reference potential, wherein the voltage difference between the drain voltage of the first field effect transistor and the drain voltage of the second field effect transistor is defined as the detection output.

A demodulator according to an eighth aspect of the present invention has a first signal input terminal to which a first high frequency signal is input, a second signal input terminal to which a second high frequency signal is input, a generating means for generating two high frequency signals having a phase difference based on at least one high frequency signal between the first high frequency signal input from the first signal input terminal and the second high frequency signal input from the second signal input terminal and including at least one output terminal for outputting generated high frequency signals, at least one power detector for receiving as input the high frequency signals output from the output terminal of the generating means and detecting the signal level of the input high frequency signals, and a conversion circuit for converting the output signal of the power detector to a plurality of signal components contained in the first or second high frequency signal, wherein the power detector has a first field effect transistor having a gate supplied with the high frequency signal and a source connected to a reference potential, a second field effect transistor having a source connected to a reference potential, a first gate bias supply circuit for supplying a gate bias voltage to the gate of the first field effect transistor, a second gate bias supply circuit for supplying a gate bias voltage to a gate of the second field effect transistor, a drain bias supply circuit for supplying a drain bias voltage to drains of the first field effect transistor and second field effect transistor, a first capacitor connected between the drain of the first field effect transistor and a reference potential, and a second capacitor connected between the drain of the second field effect transistor and a reference potential, wherein the voltage difference between the drain voltage of the first field effect transistor and the drain voltage of the second field effect transistor is defined as the detection output.

According to the present invention, in the power detector, the first field effect transistor and the second field effect transistor are used as active elements.

The high frequency signal is supplied via for example a matching circuit or DC (direct current) cutting capacitor to the gate of the first field effect transistor.

Also, the gate of the first field effect transistor is supplied with a gate bias voltage of the first gate bias supply circuit. Similarly, the gate of the second field effect transistor is supplied with for example a gate bias voltage substantially equal to the first gate bias voltage of the second gate bias supply circuit.

Also, the drains of the first field effect transistor and second field effect transistor are supplied with drain bias voltages via for example resistors having substantially equal resistance values.

Between the drains of the first field effect transistor and the second field effect transistor and the reference potential (ground potential), first and second capacitors having sufficiently large capacitance values are connected, so the drains of the first field effect transistor and second field effect transistor exhibit a stable state in terms of high frequency, and the voltage difference between the voltage of the drain of the first field effect transistor and the voltage of the drain of the second field effect transistor is supplied as the detection output signal to for example the conversion circuit of the latter stage.

BEST MODE FOR WORKING THE INVENTION

Below, an explanation will be made of embodiments of the present invention by referring to the attached drawings.

Figure 7:
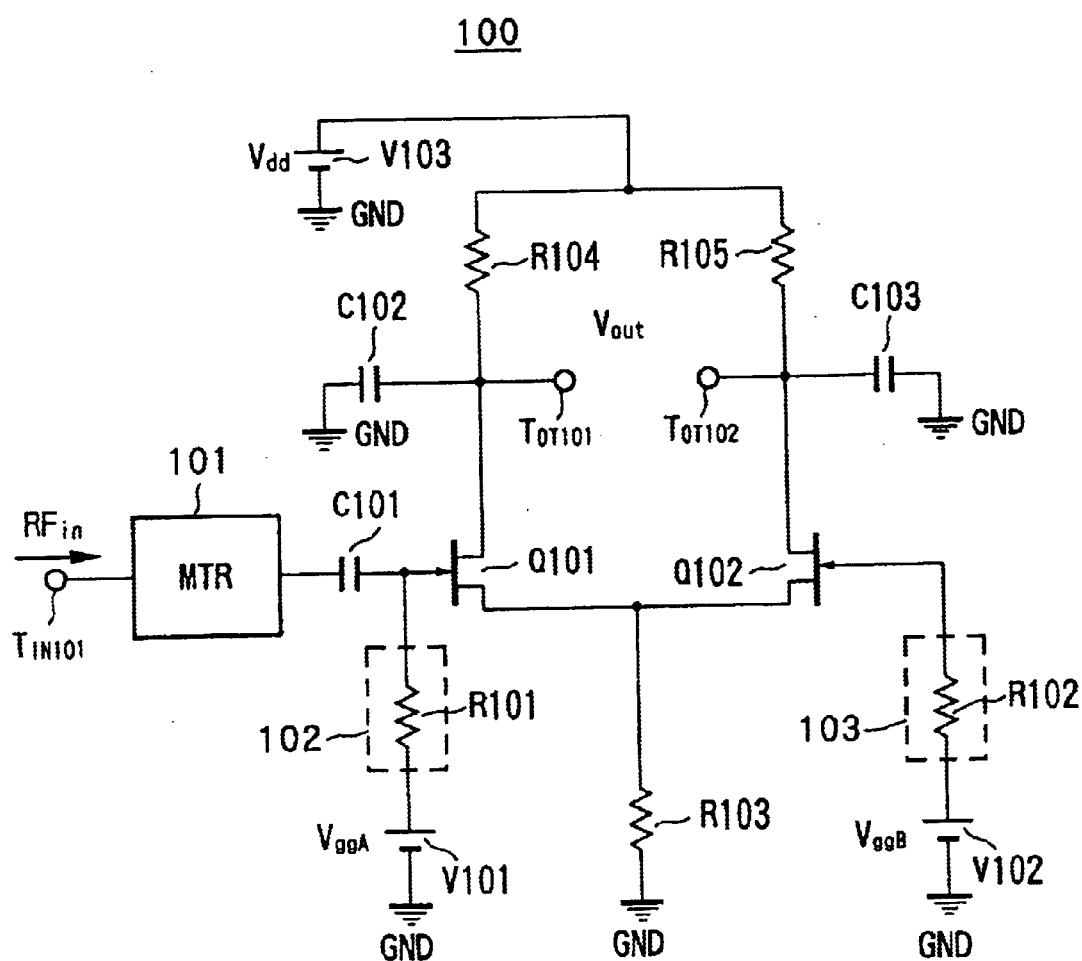
FIG. 7 is a circuit diagram of a first embodiment of a high frequency power detector according to the present invention.

FIG. 7 is a circuit diagram of a first embodiment of a high frequency power detector according to the present invention.

A high frequency power detector 100 according to the present first embodiment is comprised of two first and second field effect transistors (hereinafter, referred to as "transistors") Q101 and Q102 as the active elements, capacitors C101, C102, and C103, resistors R101, R102, R103, R104, and R105, voltage sources V101, V102, and V103, and a matching circuit (MTR) 101.

The gate of the transistor Q101 is connected to one electrode of the DC cutting capacitor C101, and the other electrode of the capacitor C101 is connected via the matching circuit 101 to an input terminal TIN101 of the high frequency signal RFin.

One end of the resistor R101 is connected to the gate of the transistor Q101, while the other end of the resistor R101 is connected to the voltage source V101 of the voltage VggA. A first gate bias supply circuit 102 for supplying the gate bias voltage of the transistor Q101 is comprised by this resistor R101.

One end of the resistor 102 is connected to the gate of the transistor Q102, while the other end of the resistor is connected to the voltage source V102 of the voltage VggB. A second gate bias supply circuit 103 for supplying the gate bias voltage of the transistor Q102 is comprised by this resistor R102.

The source of the transistor Q101 and the source of the transistor Q102 are connected. The connecting point thereof is connected via the resistor R103 to the ground potential GND.

The drain of the transistor Q101 is connected to one end of the resistor R104, one electrode of the capacitor C102, and a first output terminal TOT101. The other end of the resistor R104 is connected to the voltage source V103 of the voltage Vdd, while the other electrode of the capacitor C102 is connected to the ground potential GND.

The drain of the transistor Q102 is connected to one end of the resistor R105, one electrode of the capacitor C103, and a second output terminal TOT102. The other end of the resistor R105 is connected to the voltage source V103 of the voltage Vdd, while the other electrode of the capacitor C103 is connected to the ground potential GND.

The drain bias voltage is supplied to the drain of the transistor Q101 via the resistor R104, while the drain bias voltage is supplied to the drain of the transistor Q102 via the resistor R105.

In the high frequency power detector 100 comprised by such a connection configuration, the transistors Q101 and Q102 serving as the active elements have an identical device structure so that they have almost the same characteristics.

The gate bias voltage of the gate bias supply circuit 102 and the gate bias voltage of the gate bias supply circuit 103 are set to substantially equal values. For example, the DC voltage VggA of the voltage source V101 and the DC voltage VggB of the voltage source V102 are set to substantially equal values, while the resistance value of the resistor R101 and the resistance value of the resistor R102 are set to substantially equal values.

Also, a resistance value Rda of the resistor R104 connected to the drain of the transistors Q101 and a resistance value Rdb of the resistor R105 connected to the drain of the transistor Q102 satisfy the condition of Rda=Rdb. Similarly, a capacitance value Couta of the capacitor C102 and a capacitance value Coutb of the capacitor C103 satisfy a condition of Couta=Coutb.

Alternatively, in the high frequency power detector 100, when the ratio of the gate width Wga of the transistor Q101 and the gate width Wgb of the transistor Q102 (Wga/Wgb) is N, conditions of Rda/Rdb=1/N and Couta=Coutb are satisfied.

The capacitance values Couta and Coutb of the capacitors C102 and C103 are set at values large enough to give impedances of almost 0 ohm at higher frequencies including the input high frequency signal RFin of a frequency fin.

Also, in the gate bias supply circuits 102 and 103, desirably isolation is established between the gates of the transistors Q101 and Q102 and the voltage source at the input signal frequency fin.

Next, an explanation will be made of the operation by the above configuration.

The high frequency signal RFin input to the input terminal TIN101 is supplied via the matching circuit 101 and the DC (direct current) cutting capacitor C101 to the gate of the transistor Q101.

Also, the gate of the transistor Q101 is supplied with the gate bias voltage of the gate bias supply circuit 102 connected to the voltage source V101 for supplying the voltage Vgg. Similarly, the gate of the transistor Q102 is supplied with the gate bias voltage of the gate bias supply circuit 103 connected to the voltage source V102 for supplying the voltage Vgg.

Also, the drains of the transistors Q101 and Q102 are supplied with the drain bias voltages via the resistors R104 and R105.

Between the drains of the transistors Q101 and Q102 and the ground potential GND, coupling capacitors C102 and C103 having sufficiently large capacitance values are connected, so the drains of the transistors Q101 and Q102 exhibit a stable state in terms of the high frequency, and the voltage difference between the voltage of the drain of the transistor Q101, that is, the voltage of the first output terminal TOT101, and the voltage of the drain of the transistor Q102, that is, the second output terminal TOT102, is supplied as the detection output signal to a not illustrated processing circuit of a latter stage.

As explained above, according to the first embodiment, the configuration was made so that two transistors (FET) Q101 and Q102 having substantially the same characteristics with sources connected to each other and connecting the resistor R103 as the current source to their connecting point were used as the active elements, substantially equal gate bias voltages were supplied to the gates of the transistors Q101 and Q102 by the gate bias supply circuits 102 and 103, and then substantially equal drain bias voltages were supplied to the drains of the transistors Q101 and Q102, and further capacitors C102 and C103 having capacitance values set at values which were substantially equal and large enough to give impedances of almost 0 ohm at higher frequencies including the input high frequency signal RFin were connected between the drains of the transistors Q101 and Q102 and the ground, the high frequency signal RFin was supplied to the gate of the transistor Q101, and the voltage difference between the drain of the transistor Q101 and the drain of the transistor Q102 was used as the detection output, so there are the following effects.

Namely, in comparison with a conventional detector using a Schottky barrier diode, the circuit can be comprised on a semiconductor process suited for high frequency for example, GaAs, so is suited for monolithic structures. Accordingly, a detector of a small size, low cost, and suitability for broadband high frequency operation can be realized.

Also, the power detector of FIG. 7 has the advantage of a high performance, high frequency detector, excellent in the linearity of the detection characteristic when compared with a conventional power detector, having a smaller fluctuation relative to the bias fluctuation, having a smaller fluctuation of detection characteristic relative to the FET threshold voltage fluctuation, and having a small DC offset.

Also, since the power detector of FIG. 7 has a balance output, there is an advantage that the connection becomes simple when the latter stage circuit has a balance input.

Figure 8:
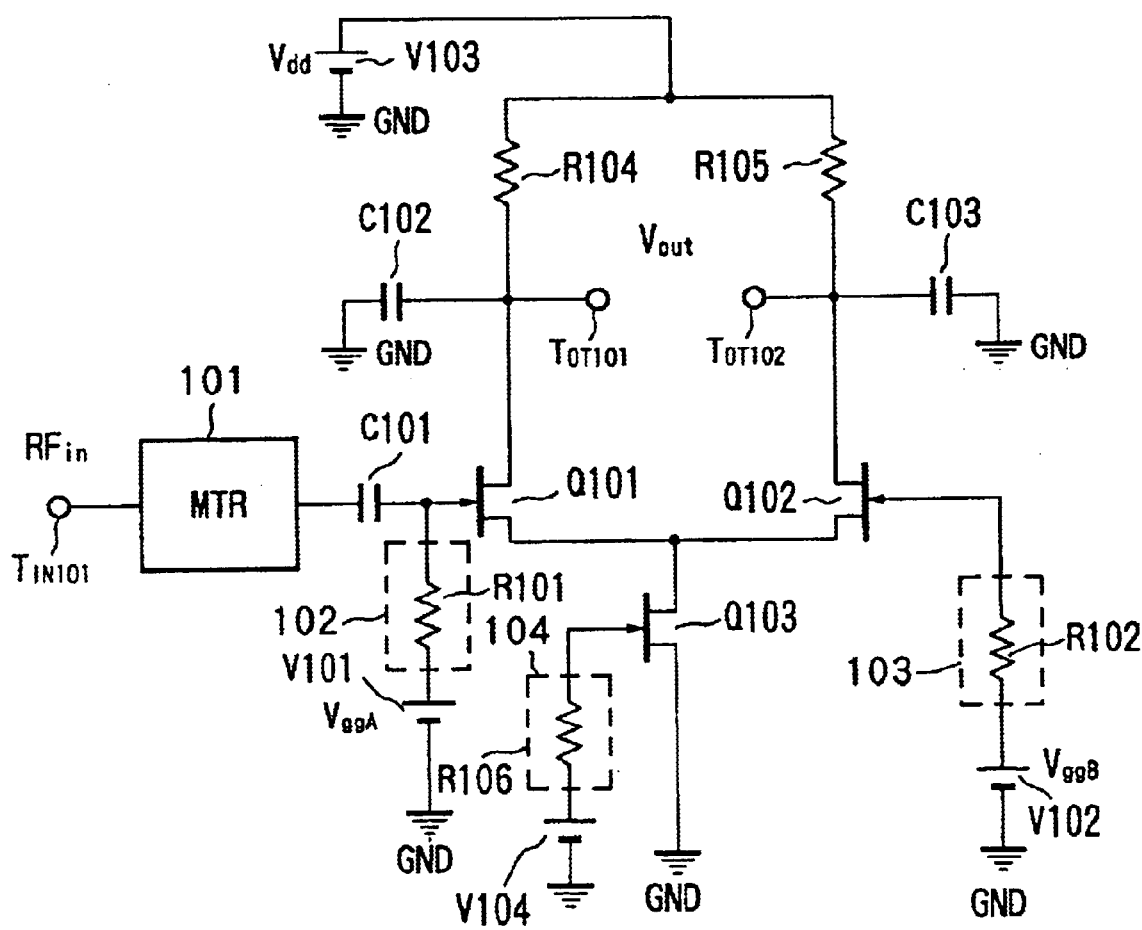
FIG. 8 is a circuit diagram of a second embodiment of a high frequency power detector according to the present invention.

FIG. 8 is a circuit diagram of a second embodiment of a high frequency power detector according to the present invention.

The difference of the present second embodiment from the first embodiment resides in that a transistor Q103 serving as a third FET having a gate with the bias voltage supplied thereto by a third gate bias supply circuit 104 is connected between the connecting point of sources of the transistors Q101 and Q102 and the ground terminal GND in place of connecting the resistor.

The gate bias supply circuit 104 is comprised of a resistor R106 connected between the gate of the transistor Q104 and a voltage source V104 of a voltage VggC.

The rest of the configuration of the second embodiment is similar to the first embodiment.

According to the second embodiment, similar effects to those of the first embodiment can be obtained.

Figure 9:
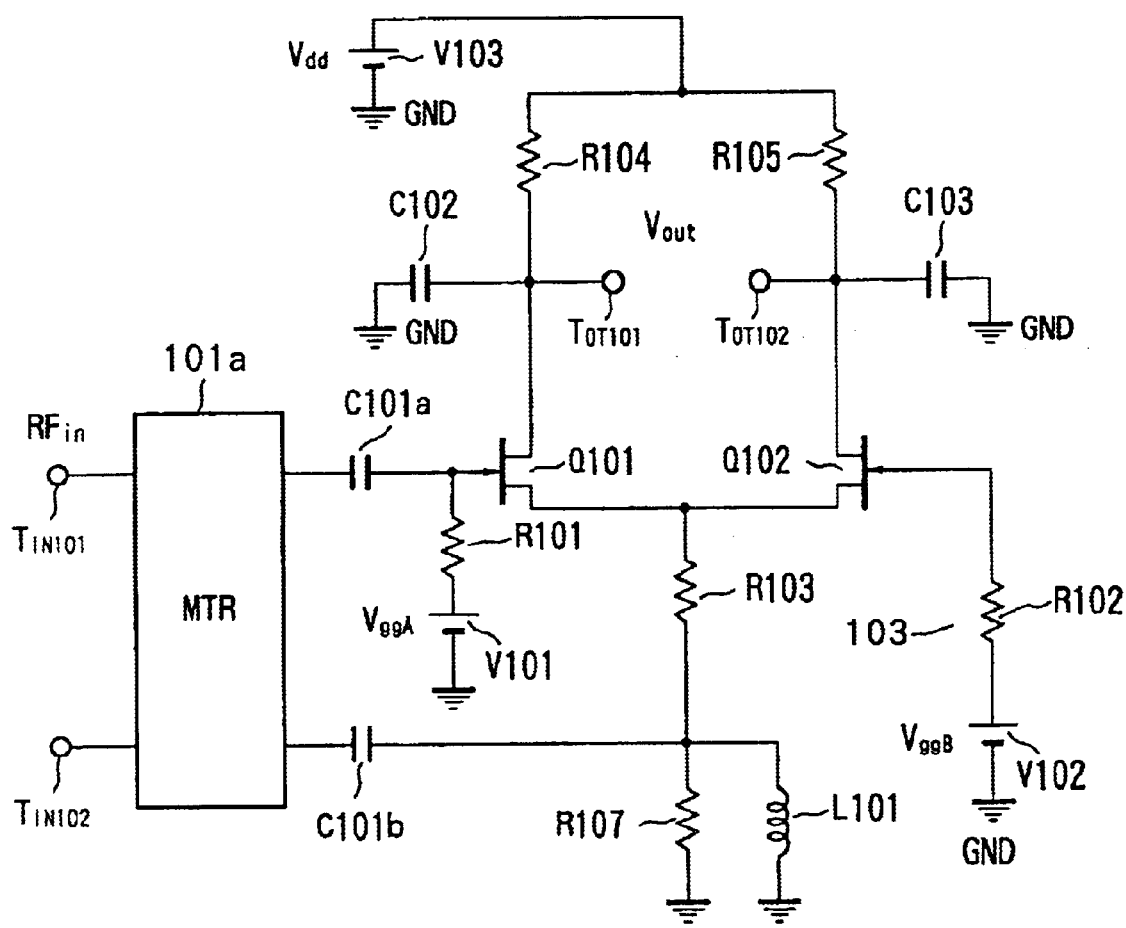
FIG. 9 is a circuit diagram of a third embodiment of a high frequency power detector according to the present invention.

FIG. 9 is a circuit diagram of a third embodiment of a high frequency power detector according to the present invention.

The difference of the third embodiment from the first embodiment resides in that the input format employs not an unbalance input, but a balance input.

For this reason, in a high frequency power detector 100B according to the third embodiment, two input terminals TIN101 and TIN102 are connected to the input side of a matching circuit 101a, and two DC cutting capacitors C101a and C101b are connected to the output side. Further, between the other end of the resistor R103 having one end connected to the connecting point of the sources of the transistors Q101 and Q102 and the ground potential GND, a resistor R107 and an inductor L101 are connected in parallel. A high frequency signal via the DC cutting capacitor C101b is supplied to the connecting point of the other end of the resistor R103, resistor R107, and the inductor L101. The reason for the connection of the resistor R107 to the other end side (ground side) of the resistor R103 is that the signal can be extracted in a state where it floats in terms of high frequency. Also, the inductor L101 was connected in parallel to the resistor R107 for achieving a short circuit state in terms of DC (direct current) since the current changes by the resistor R107 when the signal is input and deterioration of sensitivity is induced.

The rest of the configuration of the present third embodiment is similar to the first embodiment.

According to the third embodiment, similar effects to those of the first embodiment can be obtained.

Figure 10:
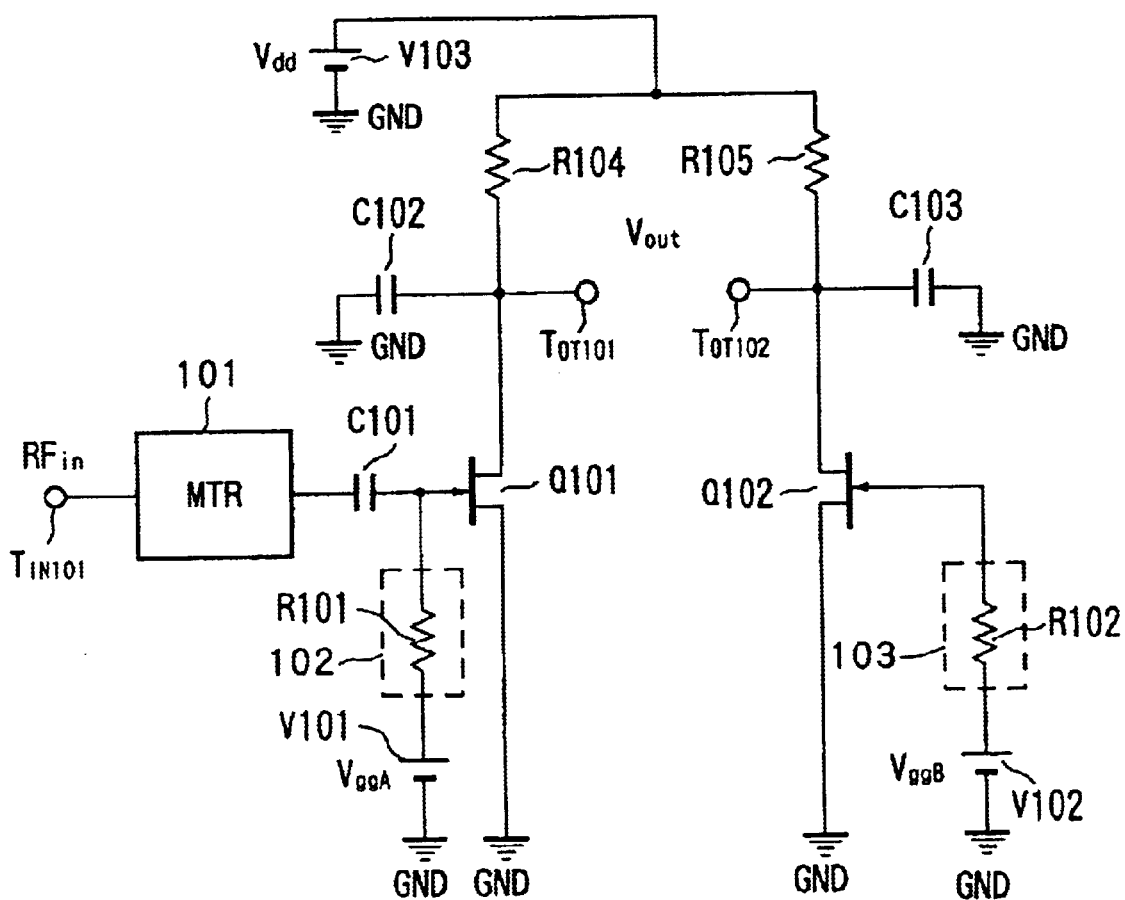
FIG. 10 is a circuit diagram of a fourth embodiment of a high frequency power detector according to the present invention.

FIG. 10 is a circuit diagram of a fourth embodiment of a high frequency power detector according to the present invention.

The difference of the fourth embodiment from the first embodiment resides in that the sources of the transistors Q101 and Q102 serving as the active elements are directly connected to the ground potential GND in place of the connection to the ground potential GND via the resistors.

In this case, the gate bias voltages supplied to the gates of the transistors Q101 and Q102 are set at values in the vicinity of the threshold voltage of the transistors Q101 and Q102.

Concretely, the transistors Q101 and Q102 have an identical device structure and gate bias voltages VggA=VggB and VggB≈Vth (Vth is the threshold voltage of the transistors Q101 and Q102).

Also, the resistance value Rda of the resistor R104 and the resistance value Rdb of the resistor R105 connected to the drains of the transistors Q101 and Q102 satisfy the condition of Rda=Rdb. Similarly, the capacitance value Couta of the capacitor C102 and the capacitance value Coutb of the capacitor C103 satisfy the condition of Couta=Coutb.

Alternatively, in the high frequency power detector 100C, when the ratio of the gate width Wga of the transistor Q101 and the gate width Wgb of the transistor Q102 (Wga/Wgb) is N, conditions of VggA=VggB≈Vth, Rda/Rdb=1/N, and Couta=Coutb are satisfied.

The rest of the configuration of the fourth embodiment is similar to the first embodiment.

According to the fourth embodiment, there are the advantages that, not only can effects similar to those by the first embodiment be obtained, but also a reduction of power consumption can be achieved.

Figure 11:
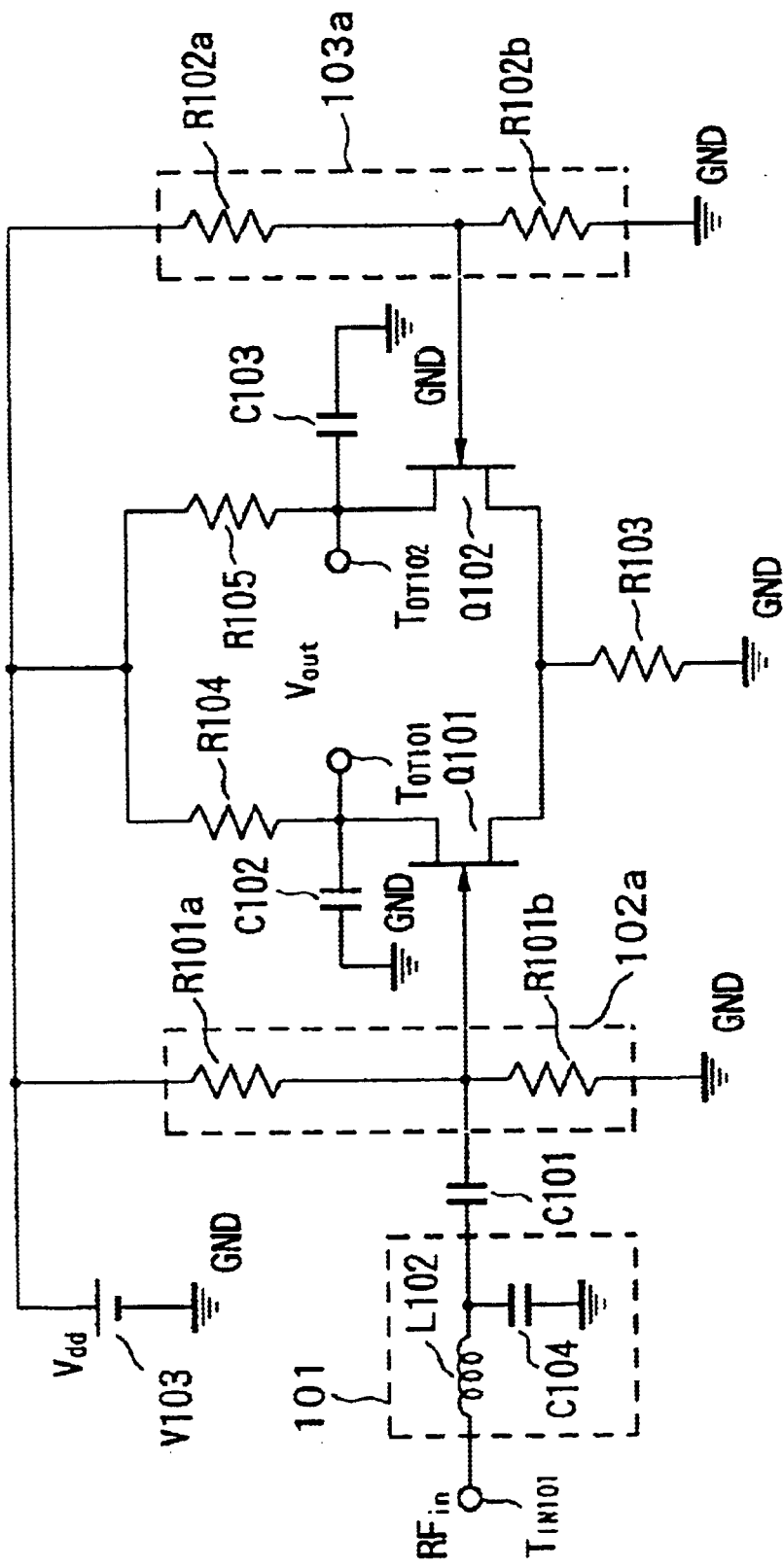
FIG. 11 is a circuit diagram of a fifth embodiment of a high frequency power detector according to the present invention.

FIG. 11 is a circuit diagram of a fifth embodiment of a high frequency power detector according to the present invention.

The difference of the fifth embodiment from the first embodiment resides in that the gate bias supply circuits 102A and 103A for the transistors Q101 and Q102 are comprised so as to generate bias voltages by dividing the resistance of the voltage Vdd of the drain bias voltage source V103.

The first gate bias supply circuit 102A is comprised of a resistor R101a and a resistor R101b connected in series between the voltage source V103 and the ground potential GND. The connecting point of the resistors R101a and R101b is connected to one electrode of the DC cutting capacitor C101 and the gate of the transistor Q101.

A second gate bias supply circuit 103A is comprised of a resistor R102a and a resistor R102b connected in series between the voltage source V103 and the ground potential GND. The connecting point of the resistors R102a and R102b is connected to the gate of the transistor Q102.

Also, in the fifth embodiment, as the matching circuit 101, an example of a matching circuit comprised by two concentrated constant elements is shown.

In the example of FIG. 11, as a concentrated constant element, use is made of an inductor L102 connected between the input terminal TIN101 and the other electrode of the DC cutting capacitor C101 and of a capacitor C104 connected between the connecting point of the inductor L102 and the capacitor C101 and the ground potential GND.

Note that, according to the object of use of the detector, there also exists a case where resistor matching and a matching circuit comprised by a distributed constant element or the like become necessary.

Also in the high frequency power detector 100D, the high frequency signal RFin of the frequency fin input to the input terminal TIN101 is supplied via the matching circuit 101 and the DC cutting capacitor C101 to the gate of the transistor Q101.

At this time, the gate bias voltages generated at the gate bias supply circuits 102a and 103a by the resistor division are supplied to the gates of the transistors Q101 and Q102.

In this way, the gate bias supply circuits 102a and 103a generate bias voltages by resistance division, so it is not necessary to establish isolation between the gates of the transistors Q101 and Q102 and the voltage source at the input signal frequency fin as in the case of the first embodiment.

Note that, it is also possible to comprise the gate bias supply circuit not only by resistance division, but by, for example, a choke coil (inductor having a sufficiently large inductance value), choke coil and shunt coupled capacitance, or distributed constant line, etc. Also, it becomes necessary for the circuit according to the fifth embodiment to achieve the same characteristics of the transistors Q101 and Q102.

Also, in the circuit according to the fifth embodiment, the resistance values Rga1 and Rgb1 of the resistors R101a and R101b comprising the gate bias supply circuits 102a and 103a and resistance values Rga2 and Rgb2 of the resistors R102a and R102b must satisfy conditions of Rga1=Rga2 and Rgb1=Rgb2, and the gate bias voltages of the transistors Q101 and Q102 must be made as equal as possible.

Also, the resistance value Rda of the resistor R104 and the resistance value Rdb of the resistor R105 connected to the drains of the transistors Q101 and Q102 satisfy the condition of Rda=Rdb. Similarly, desirably the capacitance value Couta of the capacitor C102 and the capacitance value Coutb of the capacitor C103 satisfy the condition of Couta=Coutb, and the capacitance values Couta and Coutb are set to capacitance values large enough to give impedances of almost 0 ohm at higher frequencies including the input high frequency signal of the input frequency fin.

Then, the voltage difference between the drain of the transistor Q101 and the drain of the transistor Q102 becomes the detection output Vout.

Below, the detection characteristics of the high frequency power detector of FIG. 11 will be considered in connection with the drawings.

Figure 12:
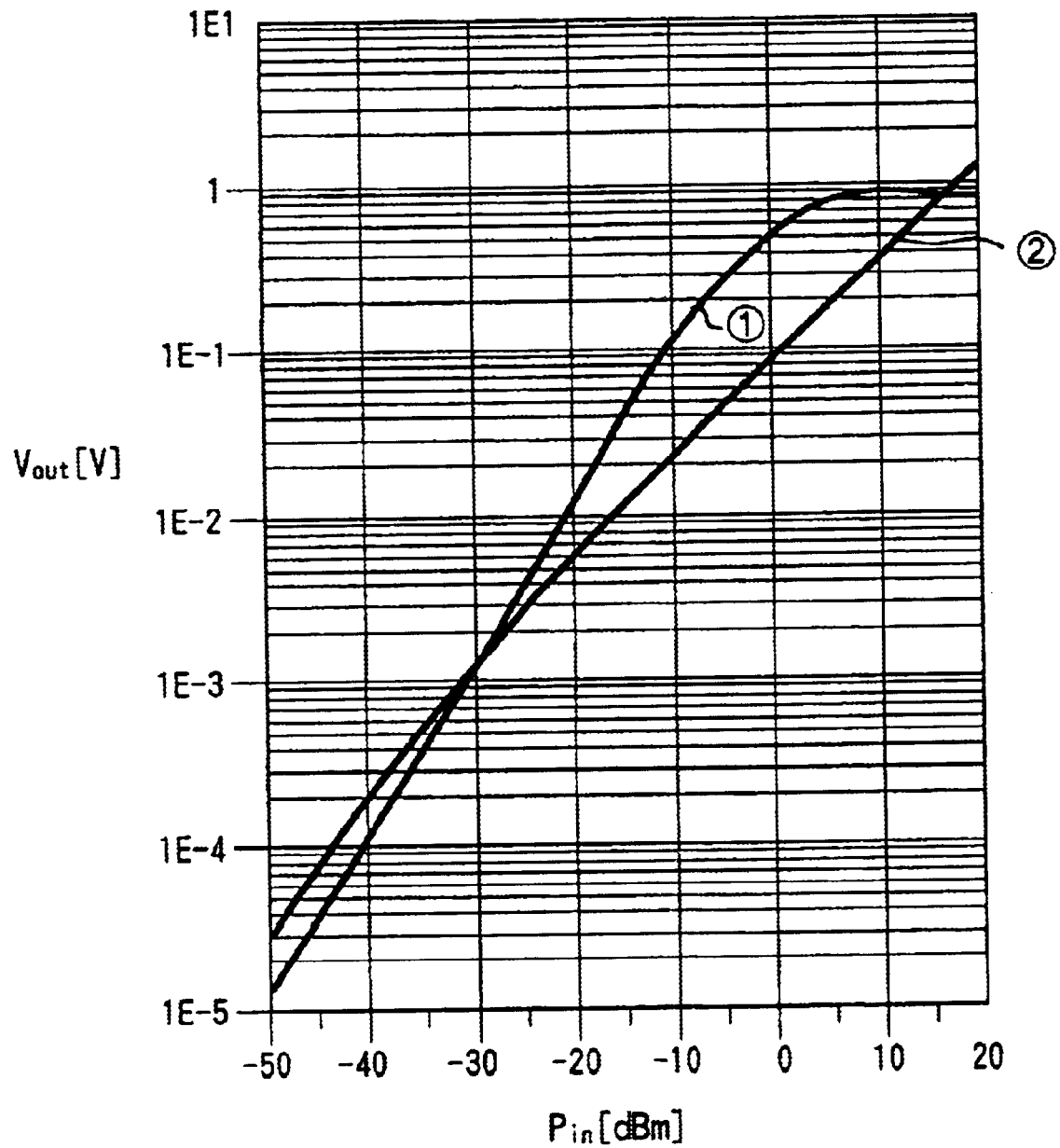
FIG. 12 is a diagram of an example of detection characteristics of the high frequency power detector of FIG. 11.

FIG. 12 is a diagram of an example of the detection characteristics of the high frequency power detector of FIG. 11.

In FIG. 12, the abscissa represents the input high frequency power Pin, and the ordinate represents the output detection voltage Vout. The frequency of the input high frequency signal is 5.5 GHz. Also, in FIG. 12, the characteristic of the power detector of FIG. 11 is indicated by a curve <1>, and the characteristic of the power detector using a FET of FIG. 5 is indicated by a curve <2> as comparative data.

Figure 1:
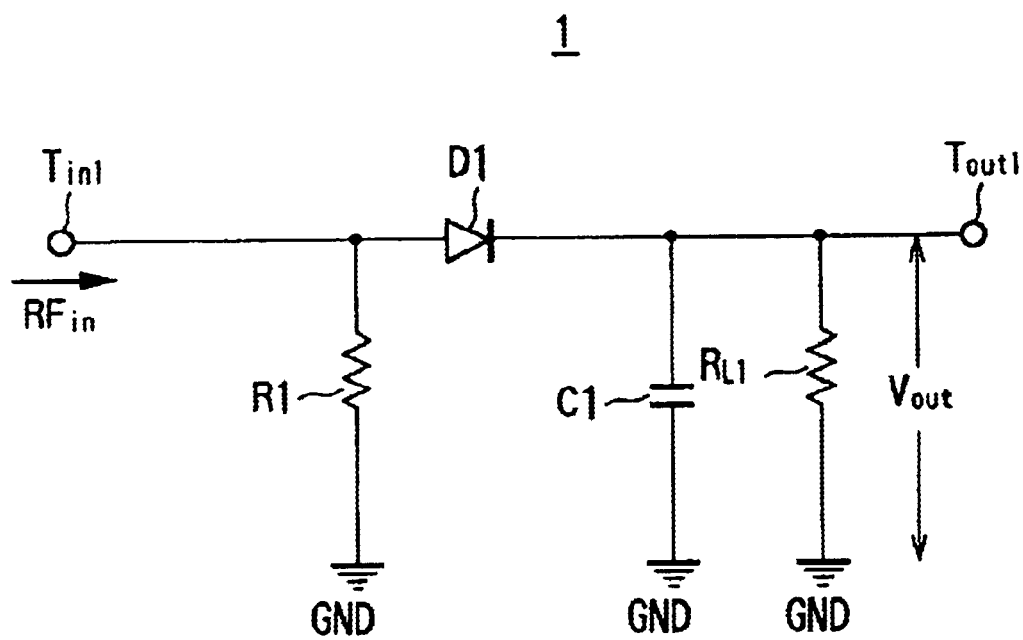
FIG. 1 is a circuit diagram of an example of the configuration of a conventional high frequency power detector using a diode.
Figure 2:
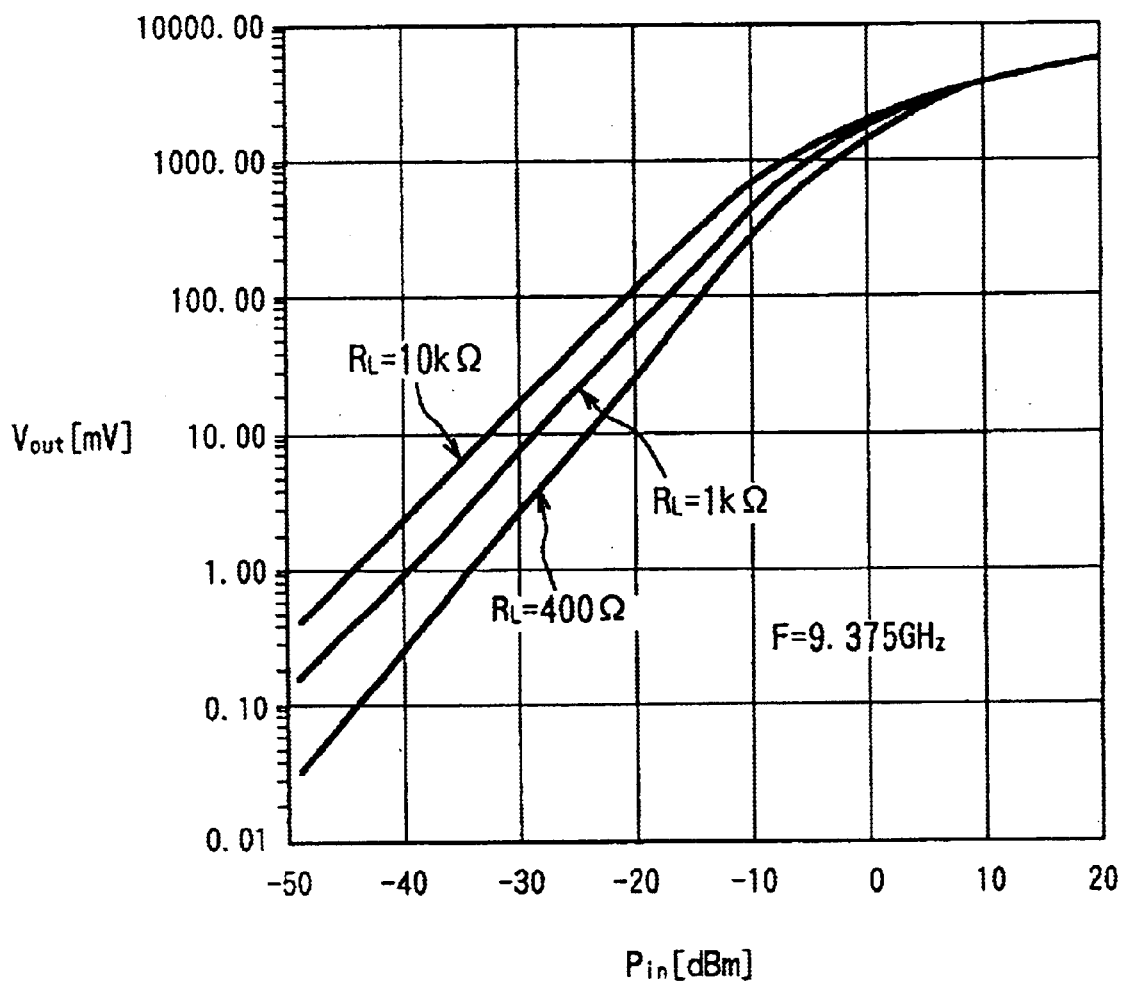
FIG. 2 is a diagram of an example of characteristics of a high frequency power detector using a diode as an active element.
Figure 3:
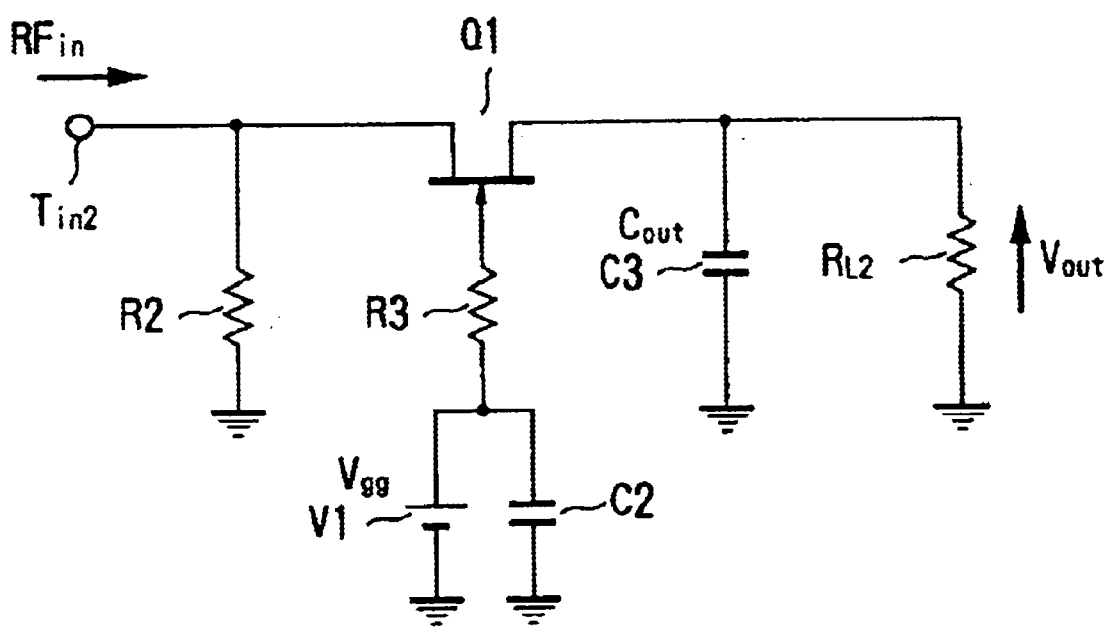
FIG. 3 is a circuit diagram of an example of the configuration of a conventional high frequency power detector using a silicon (Si) MOSFET.
Figure 4:
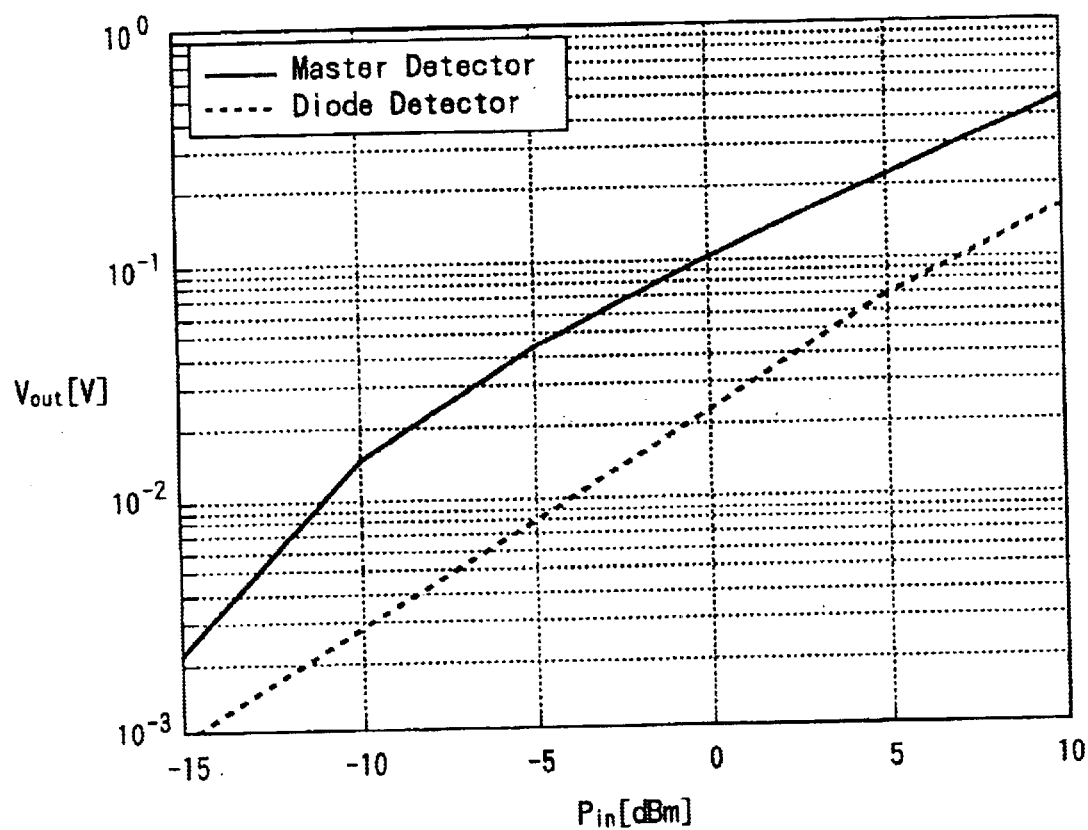
FIG. 4 is a diagram of an example of characteristics of the high frequency power detector of FIG. 3 using an SiMOSFET.
Figure 5:
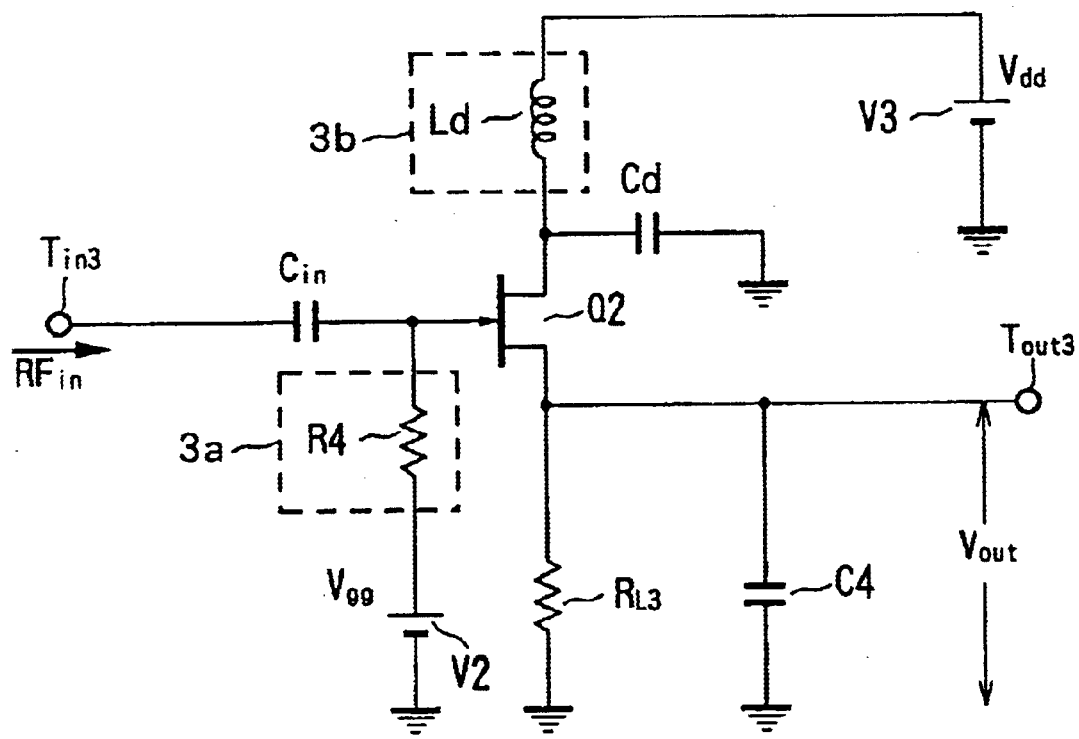
FIG. 5 is a circuit diagram of another example of the configuration of a high frequency power detector using a field effect transistor as an active element.

As seen from FIG. 12, the power detector of FIG. 11 has a good linearity in comparison with the power detector of FIG. 5.

Figure 6:
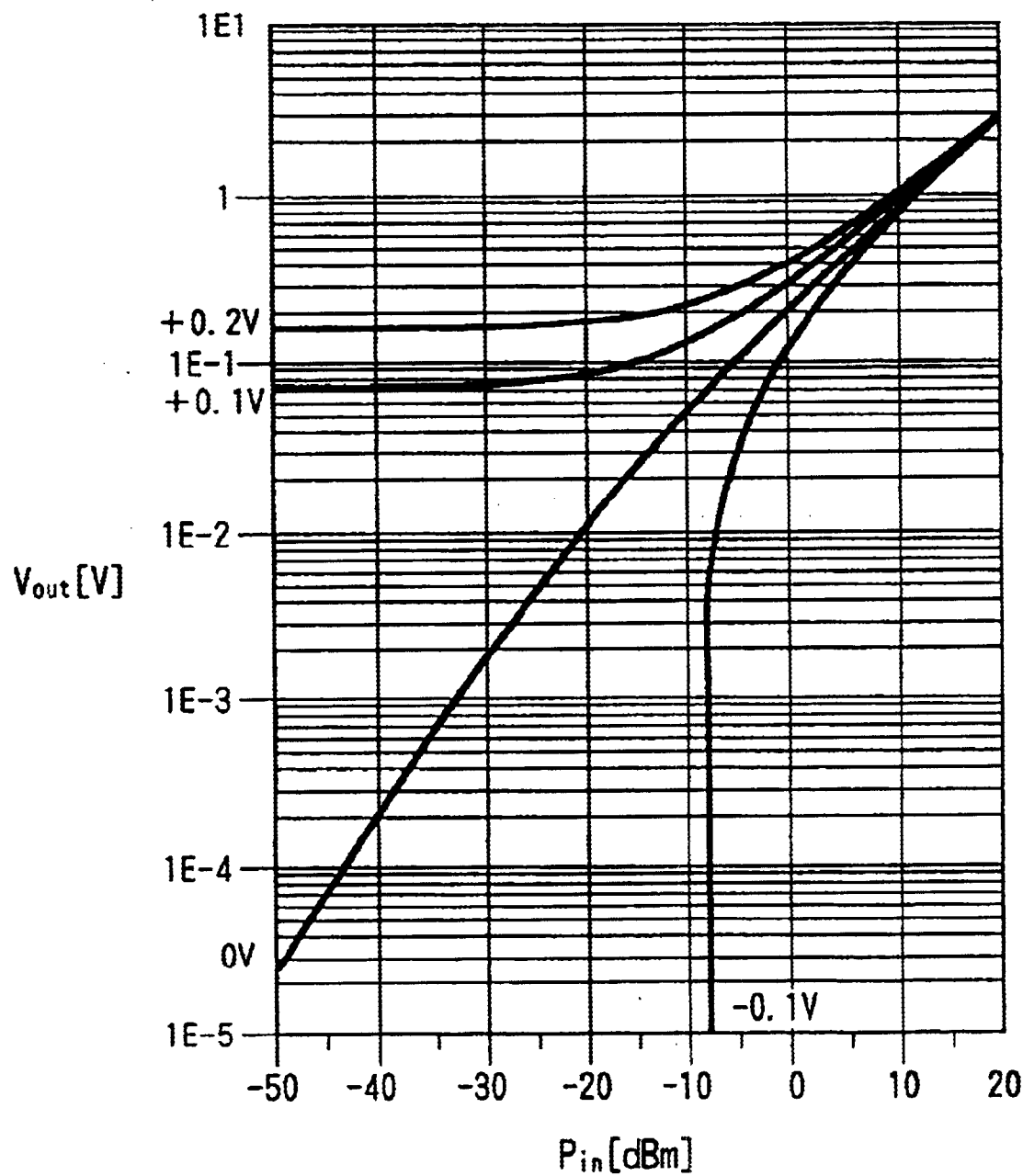
FIG. 6 is a diagram of a detection characteristic of a high frequency power detector using a field effect transistor as the active element of FIG. 5.
Figure 13:
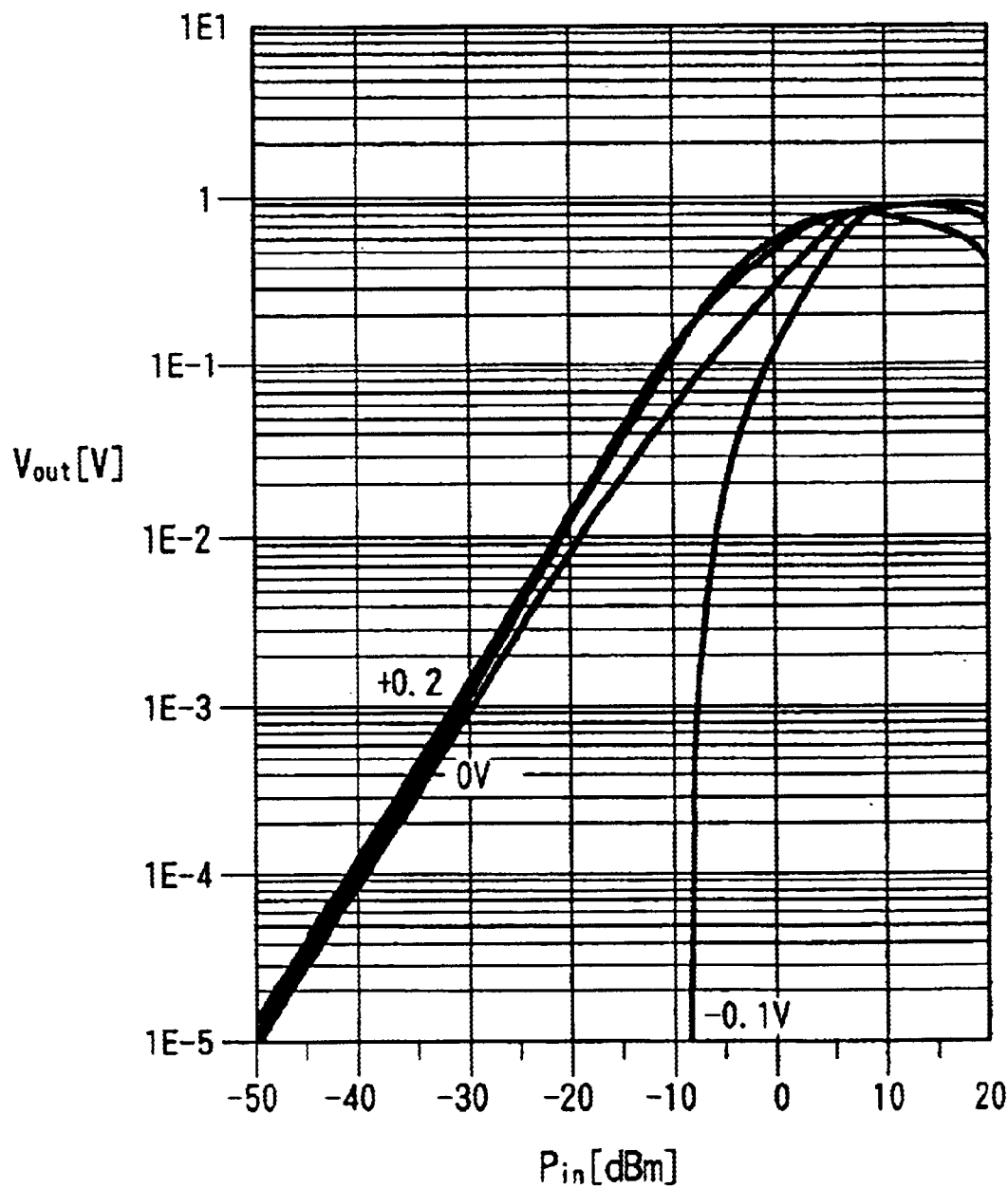
FIG. 13 is a diagram of a high frequency input power Pin versus output detection voltage Vout characteristic when gate bias voltages VggA and VggB are used as parameters in the circuit of FIG. 11 and corresponds to FIG. 6 showing the characteristics of the conventional example.

Also, FIG. 13 is a diagram of a high frequency input power Pin versus output detection voltage Vout characteristic when the gate bias voltages VggA and VggB are used as parameters and corresponds to FIG. 6 showing characteristics of the conventional example.

Also in FIG. 13, the abscissa represents the input high frequency power Pin, while the ordinate represents the output detection voltage Vout.

It is learned that in the characteristic of the power detector according to the fifth embodiment shown in FIG. 13, compared with the characteristic of the conventional power detector shown in FIG. 5, the fluctuation of the Pin versus Vout characteristic is smaller relative to the gate bias fluctuation.

Concretely, in FIG. 6 showing the characteristics of the conventional circuit, when Vgs is large, for example when Vgs=±0.1V or more, a DC offset voltage is generated when Pin is small.

Contrary to this, in FIG. 13 showing the characteristics of the power detector according to the fifth embodiment, the DC offset is not generated.

Accordingly, the results of FIG. 13 show that, in the power detector according to the fifth embodiment, the variability of the Pin versus Vout characteristic is small in comparison with the conventional power detector such as FIG. 5 even if the threshold voltage of the FET varies.

According to the fifth embodiment, similar to the first embodiment, in comparison with the conventional power detector using a silicon Schottky diode, the circuit can be comprised on a semiconductor process suited for high frequency such as GaAs, so it is suitable for monolithic structures. Accordingly, a power detector of a small size, low cost, and suitability for a broadband high frequency operation can be realized.

Also, the power detector of FIG. 11 has the advantage that a high performance power detector excellent in the linearity of the detection characteristic, having a fluctuation of detection characteristic smaller relative to the bias fluctuation, having a small fluctuation of detection characteristic relative to the FET threshold voltage fluctuation, and in addition having a small DC offset in comparison with the conventional detector can be realized.

Figure 14:
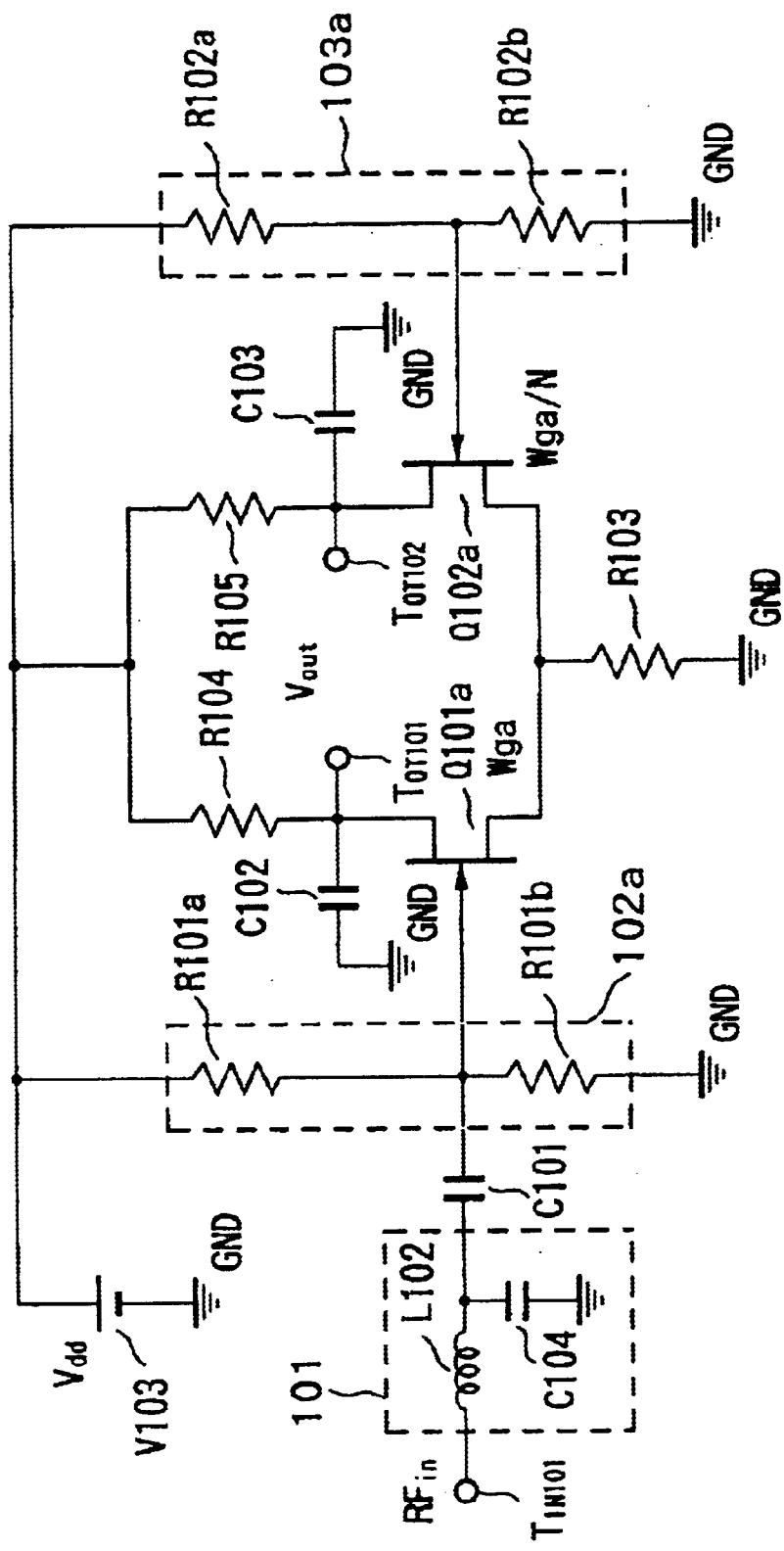
FIG. 14 is a circuit diagram of a sixth embodiment of a high frequency power detector according to the present invention.

FIG. 14 is a circuit diagram of a sixth embodiment of a high frequency power detector according to the present invention.

The difference of the sixth embodiment from the fifth embodiment resides in that the consumed current is enhanced by setting the gate width Wgb of the transistor Q102a smaller than the gate width Wga of the transistor Q101a, and then setting the resistance value Rdb of the drain bias resistor R105 larger than the resistance value Rda of the resistor R104.

Note that the power detector 100E shown in FIG. 14 is a similar circuit as an equivalent circuit to the power detector 100D shown in FIG. 11.

In the power detector of FIG. 11 according to the fifth embodiment, it is necessary to make the characteristics of the transistors Q101 and Q102 equal. Therefore, the gate width Wga of the transistor Q101 and the gate width Wgb of the transistor Q102 are equal.

Contrary to this, in the power detector 100E of FIG. 14 according to the present sixth embodiment, the ratio Wga/Wgb of the gate width Wga of the transistor Q101 and the gate width Wgb of the transistor Q102 is set at N, and further the resistance value Rdb of the resistor R105a is set at N times the resistance value Rda of the resistor R104a.

By this, in the power detector 100E of FIG. 14 according to the sixth embodiment, in comparison with the power detector 100D of FIG. 10, the current consumption can be reduced to (N+1)/(2N) times.

Namely, according to the sixth embodiment, there are advantages in that not only can effects similar to those in the fifth embodiment be obtained, but also the current consumption can be reduced.

Figure 15:
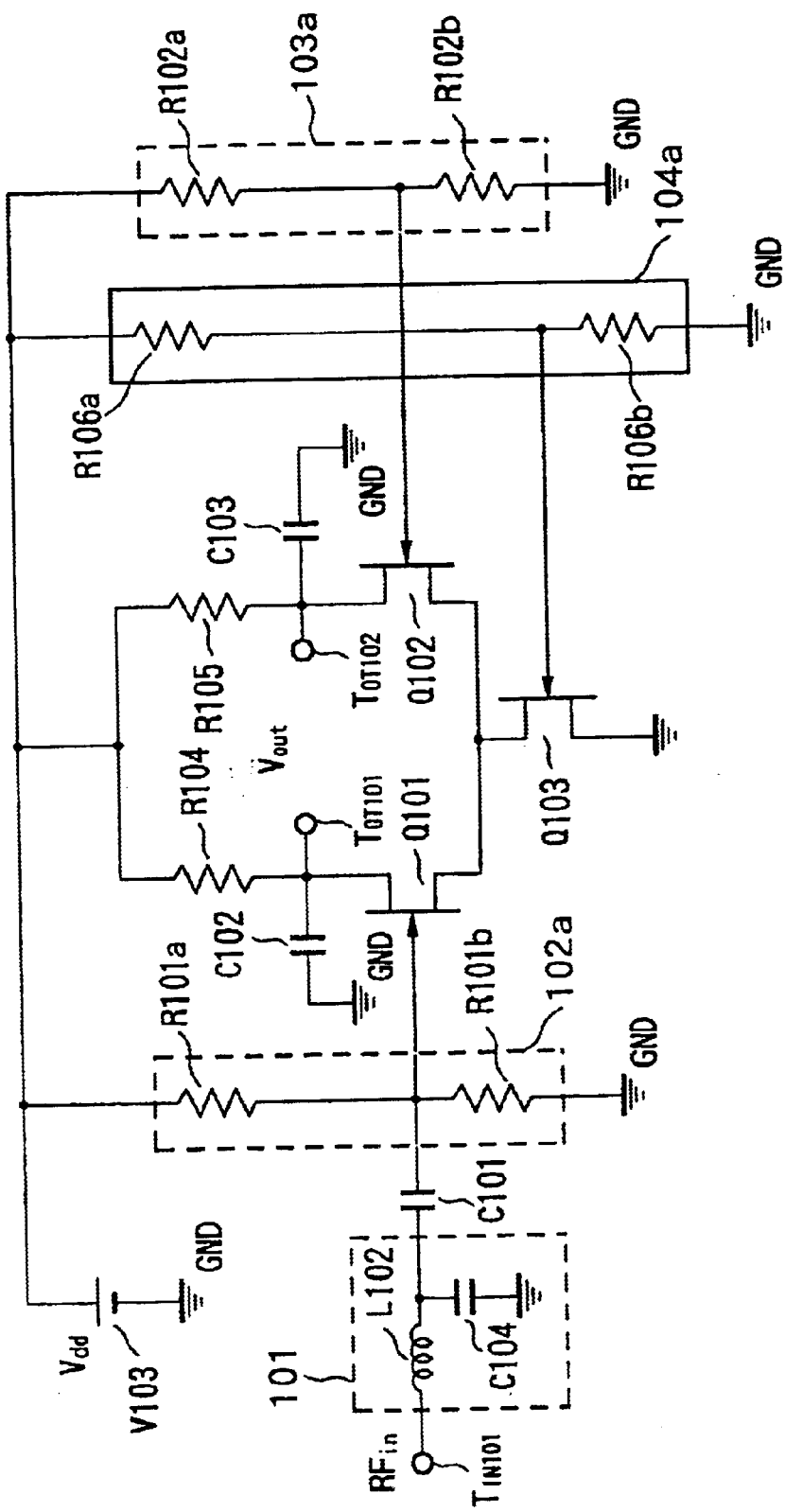
FIG. 15 is a circuit diagram of a seventh embodiment of a high frequency power detector according to the present invention.

FIG. 15 is a circuit diagram of a seventh embodiment of a high frequency power detector according to the present invention.

The differences of the seventh embodiment from the second embodiment reside in that, similar to the fifth embodiment, the gate bias supply circuits 102a and 103a for the transistors Q101 and Q102 are comprised so as to generate bias voltages by the resistance division of the voltage Vdd of the drain bias voltage source V103 and in that the third gate bias supply circuit 104a for the transistor Q103 serving as the current source is comprised so as to generate bias voltage by the resistance division of the voltage Vdd of the drain bias voltage source V103.

The first gate bias supply circuit 102a is comprised of the resistor R101a and the resistor R101b connected in series between the voltage source V103 and the ground potential GND. The connecting point of the resistors R101a and R101b is connected to one electrode of the DC cutting capacitor C101 and the gate of the transistor Q101.

The second gate bias supply circuit 103a is comprised by the resistor R102a and the resistor R102b connected in series between the voltage source V103 and the ground potential GND. The connecting point of the resistors R102a and R102b is connected to the gate of the transistor Q102.

The third gate bias supply circuit 104a is comprised by the resistor R106a and the resistor R106b connected in series between the voltage source V103 and the ground potential GND. The connecting point of the resistors R106a and R106b is connected to the gate of the transistor Q103.

The rest of the configuration of the seventh embodiment is similar to that of the second embodiment.

According to the seventh embodiment, similar effects to those by the first and fifth embodiments can be obtained.

Various aspects of the high frequency power detector according to the present invention were explained above as the first to seventh embodiments.

Below, an explanation will be made of an N-port demodulator to which these high frequency power detector circuits according to the present invention can be applied. Note that, in the following explanation, in place of the seven reference numerals of 100 and 100A to 100F used in the above description, the high frequency power detector (PD) is indicated by the reference numeral 100G including all circuits.

Figure 16:
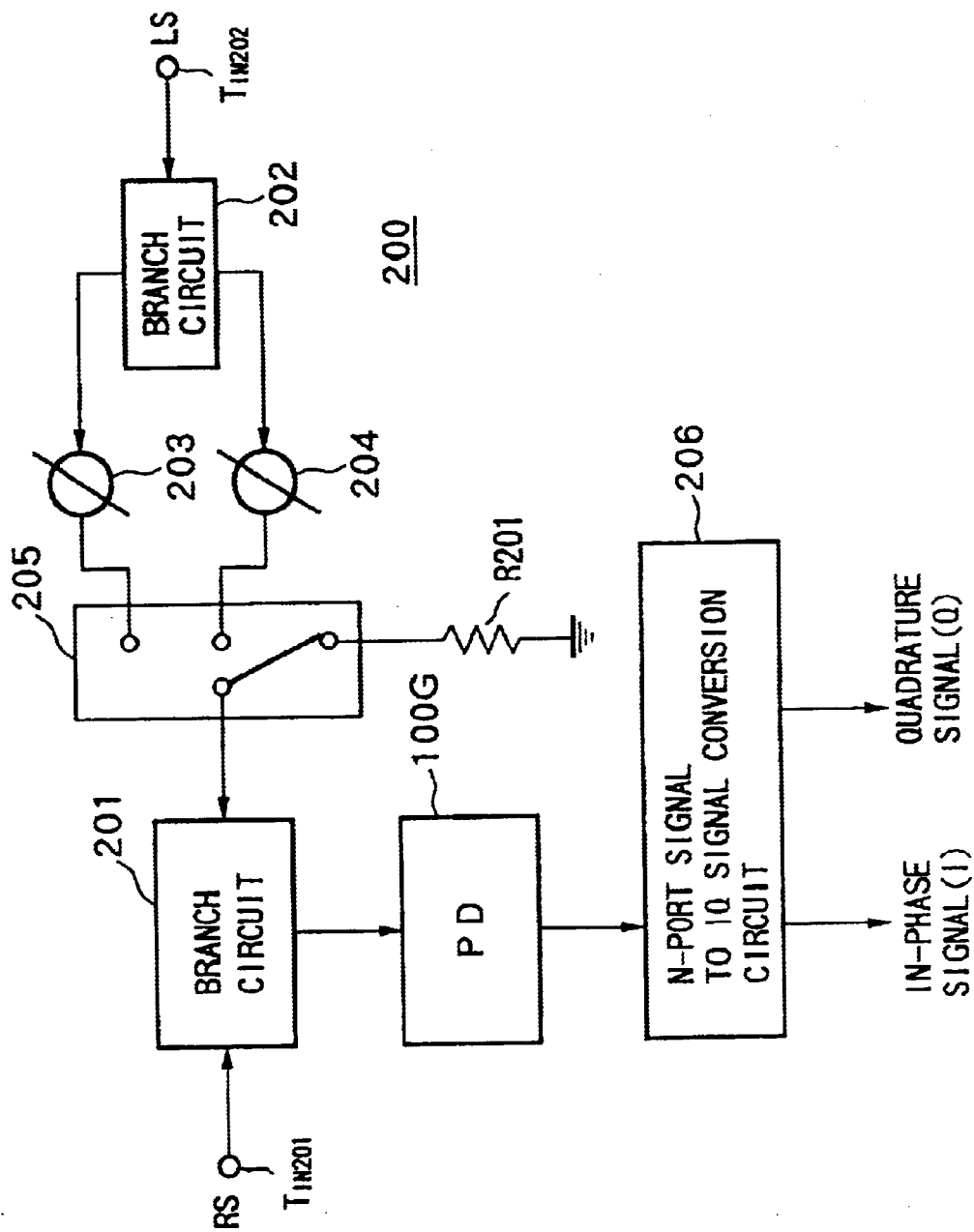
FIG. 16 is a circuit diagram of an example of the configuration of a 3-port demodulator to which the high frequency power detector according to the present invention can be applied.

FIG. 16 is a circuit diagram of an example of the configuration of a 3-port demodulator to which the high frequency power detector according to the present invention can be applied.

This 3-port demodulator 200 is comprised by using one high frequency power detector 100G and further has a reception signal use first signal input terminal TIN201, local signal use second signal input terminal TIN202, branch circuits 201 and 202, phase shifters 203 and 204, a switching circuit 205, and an N-port signal-IQ signal conversion circuit 206.

Here, "3-port" means the three ports obtained by adding one port of the output terminal to the power detector 100G of the branch circuit 201 to the two ports of the reception signal use first signal input terminal TIN201 and the local signal use second signal input terminal TIN202.

Note that, in the demodulator of FIG. 16, the generating means is comprised by the branch circuits 201 and 202, phase shifters 203 and 204, and the switching circuit 205.

In this 3-port demodulator 200, a reception signal RS input to the input terminal TIN201 is input to the branch circuit 201 and branched to two signals. One branched signal is input to the power detector 100G.

Also, a local signal LS input to the input terminal TIN202 is input to the branch circuit 202 and branched to two signals. One branched signal is input to the phase shifter 203, given a phase shift e and then input to the switching circuit 205. The other signal branched at the branch circuit 202 is input to the phase shifter 204, given the phase shift θ, and then input to the switching circuit 205. Then, the signal subjected to a phase shift function by the phase shifter 203 and the phase shifter 204 is sequentially changed over by the switching circuit 205 and supplied to the branch circuit 201.

The signal input to the branch circuit 201 is branched to two signals to be supplied to the power detector 100G and the input terminal TIN201.

In the power detector 100, the amplitude component of the input signal is detected and supplied to the conversion circuit 206. Then, in the conversion circuit 206, the input signal is converted to an in-phase signal (I) and a quadrature signal (Q) as demodulated signals and output.

According to the 3-port demodulator 200, the power detector 100G can be easily used for broadband applications, so it can be applied to a system for which a multi-band or wide band characteristic is required. Further, demands for raising the frequency can be coped with.

Also, the power detector 100G operates in a linear region, so demodulation is possible also by a low local signal power, and a low distortion demodulation is possible.

Figure 17:
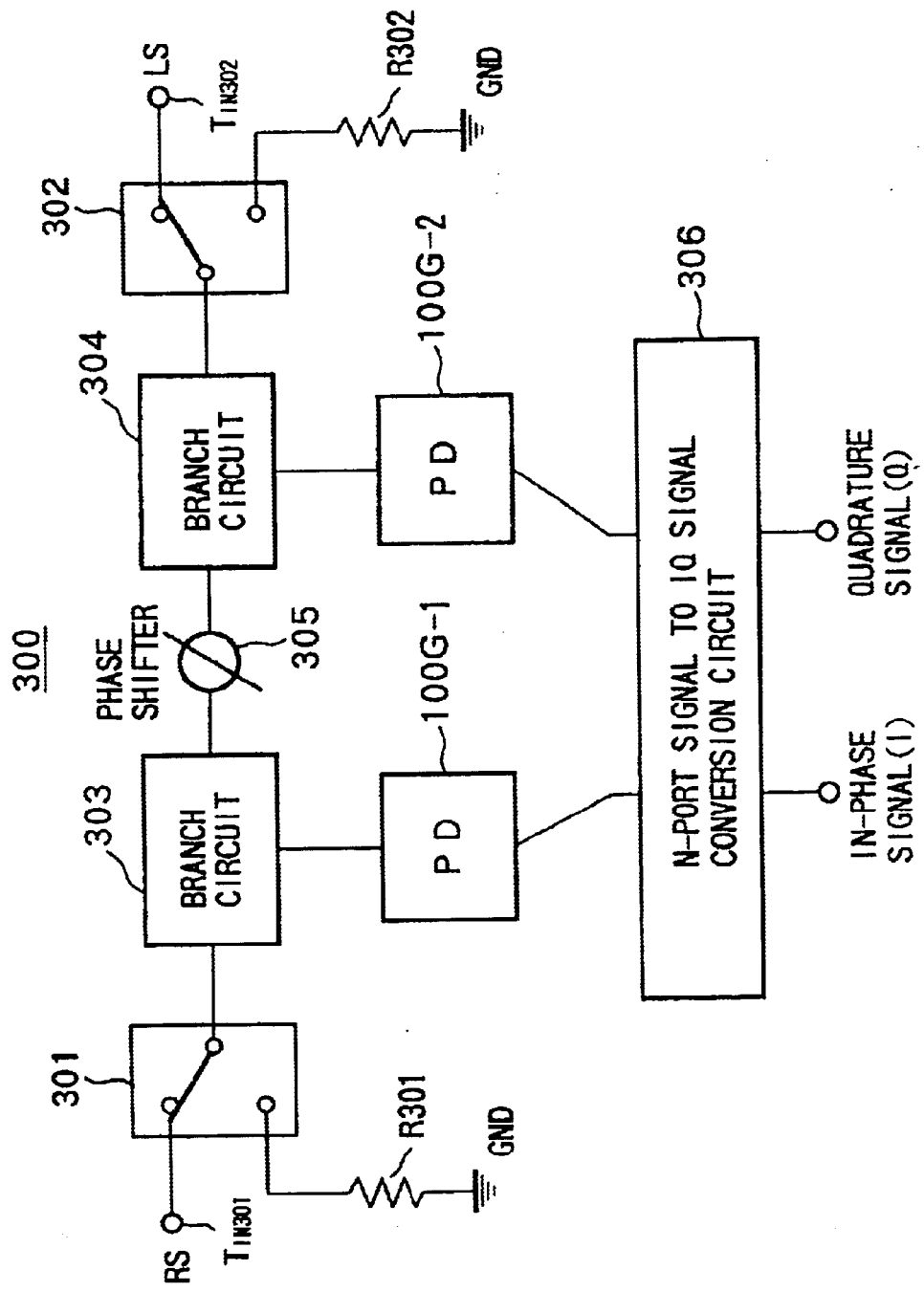
FIG. 17 is a circuit diagram of an example of the configuration of a 4-port demodulator to which the high frequency power detector according to the present invention can be applied.

FIG. 17 is a circuit diagram of an example of the configuration of a time division 4-port demodulator to which the high frequency power detector according to the present invention can be applied.

This 4-port demodulator 300 is comprised by using two high frequency power detectors 100G-1 and 100G-2 and further has a reception signal use input terminal TIN301, local signal use input terminal TIN302, switching circuits 301 and 302, branch circuits 303 and 304, phase shifter 305, and N-port signal-IQ signal conversion circuit 306.

Here, "4-port" means the four ports obtained by adding the two ports of the output terminal to the power detector 100G-1 of the branch circuit 303 and the output terminal to the power detector 100G-2 of the branch circuit 304 to the two ports of the reception signal use first input terminal TIN301 and the local signal use second input terminal TIN302.

Note that, in the demodulator of FIG. 17, the generating means is comprised by the switching circuits 301 and 302, branch circuits 303 and 304, and the phase shifter 305.

In this 4-port demodulator 300, the reception signal RS input to the input terminal TIN301 is input to the branch circuit 303 via the high speed switching circuit 301 and branched to two signals. One branched signal is input to the power detector 100G-1, and the other signal is input to the phase shifter 305.

In the phase shifter 305, a phase shift e is given to the reception signal of the branch circuit 303, and a signal subjected to the phase shift action is input to the branch circuit 304 and branched to two signals. At the branch circuit 304, one branched signal is input to the power detector 100G-2, while the other signal is supplied to the high speed switching circuit 302.

Also, the local signal LS input to the input terminal TIN302 is input via the high speed switching circuit 302 to the branch circuit 304 and branched to two signals. One branched signal is input to the power detector 100G-2, while the other signal is input to the phase shifter 305.

At the phase shifter 305, a phase shift θ is given to the local signal by the branch circuit 304, while the signal subjected to the phase shift action is input to the branch circuit 303 and branched to two signals. At the branch circuit 303, one branched signal is input to the power detector 100G-1, while the other signal is supplied to the high speed switching circuit 301.

The power detector 100G-1 is supplied with the reception signal and the local signal given the phase shift θ. At the power detector 100G-1, the amplitude component of the supplied signal is detected and supplied to the conversion circuit 306.

Also, the power detector 100G-2 is supplied with the local signal and the reception signal given the phase shift θ. At the power detector 100G-2, the amplitude component of the supplied signal is detected and supplied to the conversion circuit 306.

Then, at the transform circuit 306, the input signal is converted to the in-phase signal (I) and quadrature signal (Q) as the demodulated signals and output.

According to the present 4-port demodulator, similar effects to those of the 3-port demodulator can be obtained.

Figure 18:
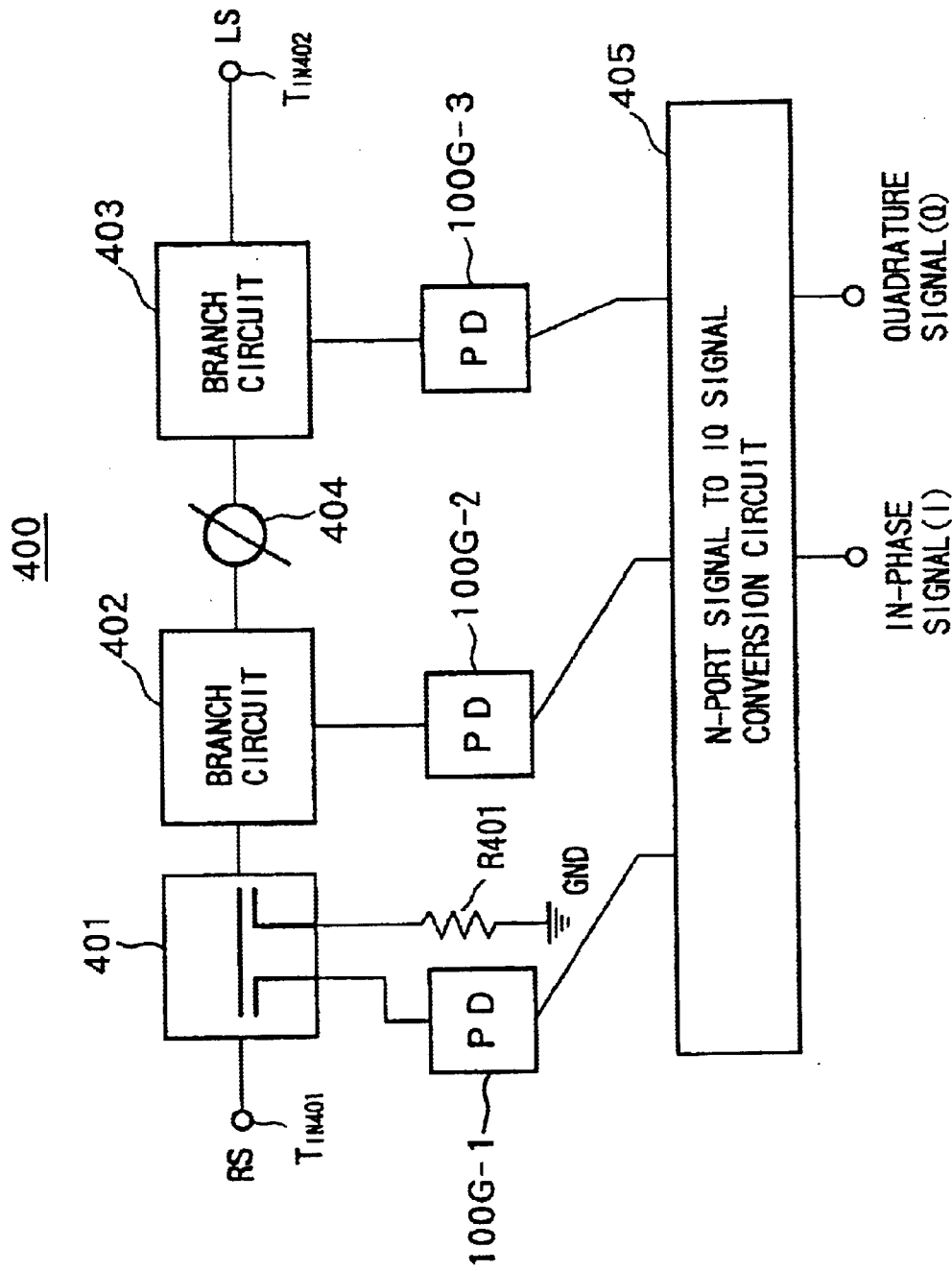
FIG. 18 is a circuit diagram of an example of the configuration of a 5-port demodulator to which the high frequency power detector according to the present invention can be applied.

FIG. 18 is a circuit diagram of an example of the configuration of a 5-port demodulator to which the high frequency power detector according to the present invention can be applied.

This 5-port demodulator 400 is comprised by using three high frequency power detectors 100G-1, 100G-2, and 100G-3 and further has a reception signal use first signal input terminal TIN401, local signal use second signal input terminal TIN402, coupler 401, branch circuits 402 and 403, phase shifter 404, and N-port signal-IQ signal conversion circuit 405. Here, "5-port" means the five ports obtained by adding three ports of the output terminal to the power detector 100G-1 of the coupler 401, the output terminal to the power detector 100G-2 of the branch circuit 402, and the output terminal to the power detector 100G-3 of the branch circuit 403 to the two ports of the reception signal use input terminal TIN401 and local signal use input terminal TIN402.

Note that, in the demodulator of FIG. 18, the generating means is comprised of the coupler 401, branch circuits 402 and 403, and the phase shifter 404.

In this 5-port demodulator 400, the reception signal RS input to the input terminal TIN401 is input to the branch circuit 402 by the coupler 401, and one part thereof is input to the power detector 100G-1.

The reception signal input to the branch circuit 402 is branched to two signals. One branched signal is input to the power detector 100G-2, while the other signal is input to the phase shifter 404.

In the phase shifter 404, a phase shift θ is given to the reception signal by the branch circuit 402, and the signal subjected to the phase shift action is input to the branch circuit 403 and branched to two signals. At the branch circuit 403, one branched signal is input to the power detector 100G-3, while the other signal is supplied to the input terminal TIN402.

Also, the local signal LS input to the input terminal TIN402 is input to the branch circuit 403 and branched to two signals. One branched signal is input to the power detector 100G-3, while the other signal is input to the phase shifter 404.

At the phase shifter 404, a phase shift e is given to the local signal by the branch circuit 403, and the signal subjected to the phase shift action is input to the branch circuit 402 and branched to two signals. At the branch circuit 402, one branched signal is input to the power detector 100G-2, while the other signal is supplied to the coupler 401.

The power detector 100G-1 is supplied with the reception signal. At the power detector 100G-1, the amplitude component of the supplied signal is detected and supplied to the conversion circuit 405.

The power detector 100G-2 is supplied with the reception signal and the local signal given the phase shift θ. At the power detector 100G-2, the amplitude component of the supplied signal is detected and supplied to the conversion circuit 405.

Also, the power detector 100G-3 is supplied with the local signal and the reception signal given the phase shift θ. At the power detector 100G-3, the amplitude component of the supplied signal is detected and supplied to the conversion circuit 405.

Then, at the conversion circuit 405, the input signal is converted to the in-phase signal (I) and quadrature signal (Q) as the demodulated signals and output.

According to the present 5-port demodulator, similar effects to those by the 3-port demodulator can be obtained.

Figure 19:
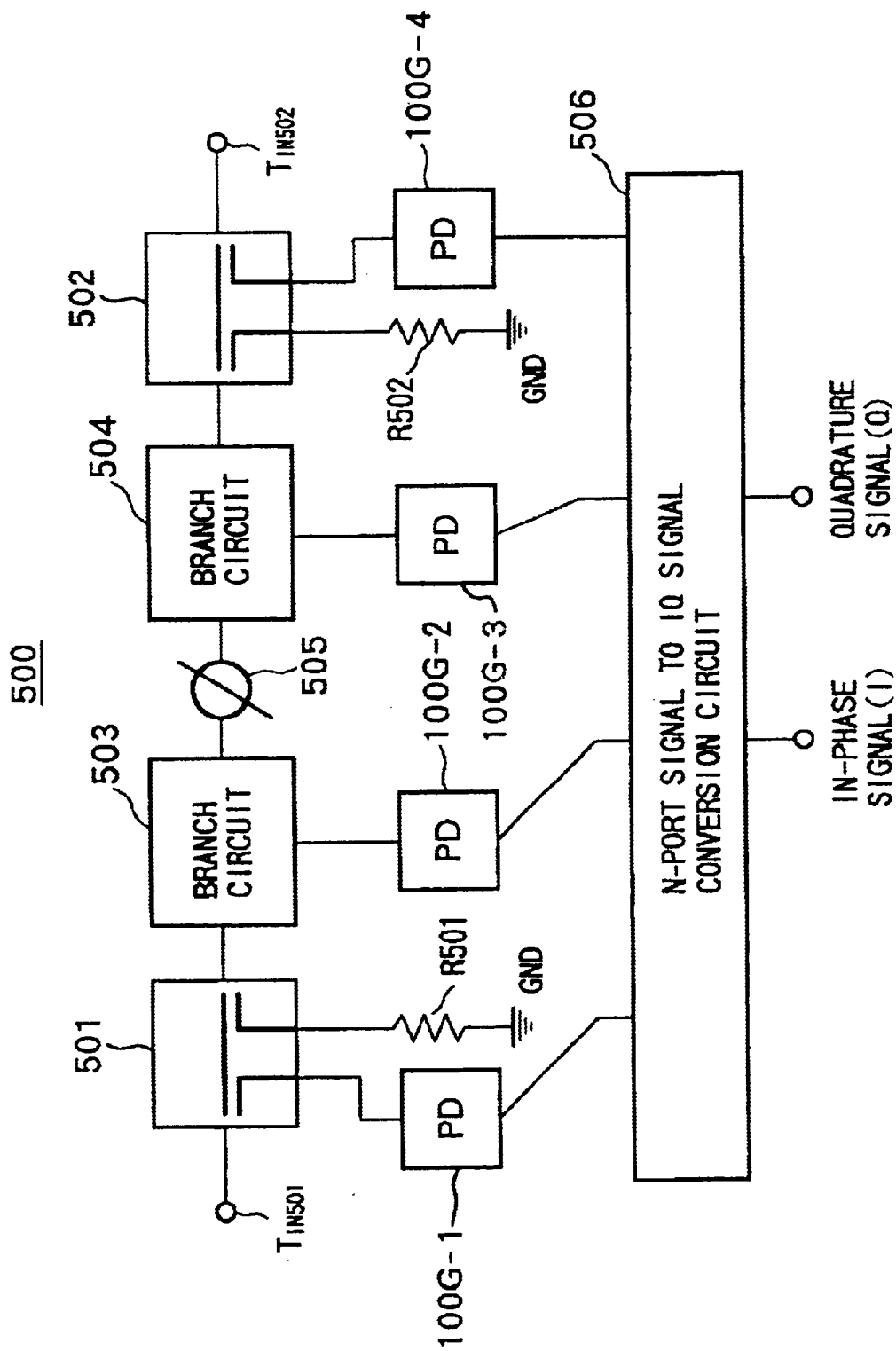
FIG. 19 is a circuit diagram of an example of the configuration of a 6-port demodulator to which the high frequency power detector according to the present invention can be applied.

FIG. 19 is a circuit diagram of an example of the configuration of a 6-port demodulator to which the high frequency power detector according to the present invention can be applied.

This 6-port demodulator 500 is comprised by using four high frequency power detectors 100G-1, 100G-2, 100G-3, and 100G-4 and further has a reception signal use first signal input terminal TIN501, local signal use second signal input terminal TIN502, couplers 501 and 502, branch circuits 503 and 504, a phase shifter 505, and an N-port signal-IQ signal conversion circuit 506.

Here, "6-port" means the six ports obtained by adding the four ports of the output terminal to the power detector 100G-1 of the coupler 501, the output terminal to the power detector 100G-2 of the branch circuit 502, the output terminal to the power detector 100G-3 of the branch circuit 503, and the output terminal to the power detector 100G-4 of the coupler 502 to the two ports of the reception signal use input terminal TIN501 and the local signal use input terminal TIN502.

Note that, at the demodulator of FIG. 19, the generating means is comprised of the couplers 501 and 502, branch circuits 503 and 504, and the phase shifter 505.

In this 6-port demodulator 500, the reception signal RS input to the input terminal TIN501 is input to the branch circuit 503 by the coupler 501, and one part thereof is input to the power detector 100G-1.

The reception signal input to the branch circuit 503 is branched to two signals. One branched signal is input to the power detector 100G-2, and the other signal is input to the phase shifter 505.

At the phase shifter 505, a phase shift θ is given to the reception signal by the branch circuit 503, and a signal subjected to the phase shift function is input to the branch circuit 504 and branched to two signals. At the branch circuit 504, one branched signal is input to the power detector 100G-3, and the other signal is input to the coupler 502.

At the coupler 502, the signal is supplied to the signal input terminal TIN502 by the coupler 501.

Also, the local signal LS input to the signal input terminal TIN502 is input to the branch circuit 504 by the coupler 502, and one part thereof is input to the power detector 100G-4.

The local signal input to the branch circuit 504 is branched to two signals. One branched signal is input to the power detector 100G-3, while the other signal is input to the phase shifter 505.

At the phase shifter 505, a phase shift θ is given to the local signal by the branch circuit 504, and the signal subjected to the phase shift action is input to the branch circuit 503 and branched to two signals. At the branch circuit 503, one branched signal is input to the power detector 100G-2, and the other signal is supplied to the coupler 501.

The power detector 100G-1 is supplied with only the reception signal. At the power detector 100G-1, the amplitude component of the supplied reception signal is detected and supplied to the conversion circuit 506.

The power detector 100G-2 is supplied with the reception signal and the local signal given the phase shift θ. At the power detector 100G-2, the amplitude component of the supplied signal is detected and supplied to the conversion circuit 506.

Also, the power detector 100G-3 is supplied with the local signal and the reception signal given the phase shift θ. At the power detector 100G-3, the amplitude component of the supplied signal is detected and supplied to the conversion circuit 506.

Also, the power detector 100G-4 is supplied with only the local signal. At the power detector 100G-4, the amplitude component of the supplied signal is detected and supplied to the conversion circuit 506.

Then, at the conversion circuit 505, the input signal is converted to the in-phase signal (I) and quadrature signal (Q) as the demodulated signals and output.

According to the present 6-port demodulator, effects similar to those by the 3-port demodulator can be obtained.

INDUSTRIAL APPLICABILITY

As described above, according to the power detector of the present invention and the demodulator using the same, since they can be comprised on a semiconductor process suited for a high frequency such as GaAs in comparison with a detector using a silicon Schottky diode, they are suited for monolithic structures. Accordingly, a detector of a small size, low cost, and suitability for broadband high frequency operation can be realized. Also, the power detector of the present invention can realize a high performance power detector excellent in linearity of the detection characteristic, having a small fluctuation of detection characteristic relative to the bias fluctuation, having a small fluctuation of detection characteristic relative the FET threshold voltage fluctuation, and having a small DC offset. Also, the power detector of the present invention has a balance output, so when the latter stage circuit has a balance input, connection becomes easy.

What is claimed is:

1. A power detector for detecting a signal level of a high frequency signal, comprising:

a first field effect transistor having a gate supplied with said high frequency signal, a second field effect transistor having a source connected to a source of said first field effect transistor, a first gate bias supply circuit for supplying a gate bias voltage to the gate of said first field effect transistor, a second gate bias supply circuit for supplying a gate bias voltage to a gate of said second field effect transistor, a resistor connected between a connecting point of sources of said first field effect transistor and second field effect transistor and a reference potential, a drain bias supply circuit for supplying a drain bias voltage to drains of said first field effect transistor and second field effect transistor, a first capacitor connected between the drain of said first field effect transistor and a reference potential, and a second capacitor connected between the drain of said second field effect transistor and a reference potential, wherein a ratio Wga/Wgb of a gate width Wga of said first field effect transistor and a gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to substantially equal, a resistance value Ra of said first drain bias resistor and a resistance value Rb of the second drain bias resistor are set so as to satisfy a condition of Ra/Rb=1/N, and the capacitance value of said first capacitor and the capacitance value of the second capacitor are set to substantially equal values, and wherein the voltage difference between the drain volt of said first field effect transistor and the drain voltage of the second field effect transistor is defined as the detection output.

2. A power detector for detecting a signal level of a high frequency signal, comprising:

a first field effect transistor having a gate supplied with said high frequency signal, a second field effect transistor having a source connected to a source of said first field effect transistor, a first gate bias supply circuit for supplying a gate bias voltage to the gate of said first field effect transistor, a second gate bias supply circuit for supplying a gate bias voltage to a gate of said second field effect transistor, a third field effect transistor connected between the connecting point of sources of said first field effect transistor and second field effect transistor and a reference potential, a third gate bias supply circuit for supplying a gate bias voltage to the gate of said third field effect transistor, a drain bias supply circuit for supplying the drain bias voltage to drains of said first field effect transistor and second field effect transistor, a first capacitor connected between the drain of said first field effect transistor and a reference potential, and a second capacitor connected between the drain of said second field effect transistor and a reference potential, wherein a ratio Wga/Wgb of a gate width Wga of said first field effect transistor and a gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to substantially equal, a resistance value Ra of said first drain bias resistor and a resistance value Rb of the second drain bias resistor are set so as to satisfy a condition of Ra/Rb=1/N, and the capacitance value of said first capacitor and the capacitance value of the second capacitor are set to substantially equal values, and wherein the voltage difference between the drain voltage of said first field effect transistor and the drain voltage of the second field affect transistor is defined as the detection output.

3. A power detector for detecting a signal level of a high frequency signal, comprising:

a first field effect transistor having a gate supplied with said high frequency signal, a second field effect transistor having a source connected to a source of said first field effect transistor, a first gate bias supply circuit for supplying a gate bias voltage to the gate of said first field effect transistor, a second gate bias supply circuit for supplying a gate bias voltage to a gate of said second field effect transistor, a first resistor and a second resistor connected in series between the connecting point of sources of said first field effect transistor and second field effect transistor and a reference potential and having the related connecting point supplied with said high frequency signal, an inductor connected between the connecting point of said first resistor and second resistor and the reference potential, a drain bias supply circuit for supplying a drain bias voltage to drains of said first field effect transistor and second field effect transistor, a first capacitor connected between the drain of said first field effect transistor and a reference potential, and a second capacitor connected between the drain of said second field effect transistor and a reference potential, wherein the voltage difference between the drain voltage of said first field effect transistor and the drain voltage of the second field effect transistor is defined as the detection output.

4. A power detector as set forth in claim 3, wherein said first field effect transistor and second field effect transistor have substantially identical characteristics, said drain bias supply circuit includes a first drain bias resistor connected between the drain of said first field effect transistor and the voltage source and a second drain bias resistor connected between the drain of said second field effect transistor and the voltage source, a resistance value of said first drain bias resistor and the resistance value of the second drain bias resistor are set at substantially equal values, and a capacitance value of said first capacitor and the capacitance value of the second capacitor are set at substantially equal values.

5. A power detector as set forth in claim 3, wherein a ratio Wga/Wgb of a gate width Wga of said first field effect transistor and a gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to substantially equal, a resistance value Ra of said first drain bias resistor and a resistance value Rb of the second drain bias resistor are set so as to satisfy a condition of Ra/Rb=1/N, and the capacitance value of said first capacitor and the capacitance value of the second capacitor are set to substantially equal values.

6. A power detector for detecting a signal level of a high frequency signal, comprising: a first field effect transistor having a gate supplied with said high frequency signal and a source connected to a reference potential, a second field effect transistor having a source connected to a reference potential, a first gate bias supply circuit for supplying a gate bias voltage to the gate of said first field effect transistor, a second gate bias supply circuit for supplying a gate bias voltage to a gate of said second field effect transistor, a drain bias supply circuit for supplying a drain bias voltage to drains of said first field effect transistor and second field effect transistor, a first capacitor connected between the drain of said first field effect transistor and a reference potential, and a second capacitor connected between the drain of said second field effect transistor and a reference potential, wherein the voltage difference between the drain voltage of said first field effect transistor and the drain voltage of said second field effect transistor is defined as the detection output.

7. A power detector as set forth in claim 6, wherein said first field effect transistor and second field effect transistor have substantially identical characteristics, said drain bias supply circuit includes a first drain bias resistor connected between the drain of said first field effect transistor and the voltage source and a second drain bias resistor connected between the drain of said second field effect transistor and the voltage source, the first gate bias voltage of said first gate bias supply circuit and the gate bias voltage of said second gate bias supply circuit are set to voltages which are substantially equal to each other and substantially equal to the threshold voltage of said first and second field effect transistors, the resistance value of said first drain bias resistor and the resistance value of the second drain bias resistor are set at substantially equal values, and the capacitance value of said first capacitor and the capacitance value of the second capacitor are set at substantially equal values.

8. A power detector as set forth in claim 6, wherein the ratio Wga/Wgb of the gate width Wga of said first field effect transistor and the gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to voltages which are substantially equal to each other and substantially equal to the threshold voltage of said first and second field effect transistors, the resistance value Ra of said first drain bias resistor and the resistance value Rb of the second drain bias resistor are set so as to satisfy the condition of Ra/Rb=1/N, and the capacitance value of said first capacitor and the capacitance value of the second capacitor are set to substantially equal values.

9. A demodulator, comprising:

a first signal input terminal to which a first high frequency signal is input, a second signal input terminal to which a second high frequency signal is input, a generating means for generating two high frequency signals having a phase difference based on at least one high frequency signal between the first high frequency signal input from said first signal input terminal and the second high frequency signal input from said second signal input terminal and including at least one output terminal for outputting generated high frequency signals, at least one power detector for receiving as the input the high frequency signals output from the output terminal of said generating means and detecting the signal level of the input high frequency signals, and a conversion circuit for converting the output signal of said power detector to a plurality of signal components contained in said first or second high frequency signal, wherein said power detector comprises a first field effect transistor having a gate supplied with said high frequency signal, a second field effect transistor having a source connected to a source of said first field effect transistor, a first gate bias supply circuit for supplying a gate bias voltage to the gate of said first field effect transistor, a second gate bias supply circuit for supplying a gate bias voltage to a gate of said second field effect transistor a resistor connected between the connect point of sources of said first field effect transistor and second field effect transistor and a reference potential, a drain bias supply circuit for supplying a drain bias voltage to drains of said first field effect transistor and second field effect transistor, a first capacitor connected between the drain of said first field effect transistor and a reference potential, and a second capacitor connected between the drain of said second field effect transistor and a reference potential, wherein the voltage difference between the drain voltage of said first field effect transistor and the drain voltage of the second field effect transistor is defined as the detection output.

10. A demodulator as set forth in claim 9, wherein, in said power detector, said first field effect transistor and second field effect transistor have substantially identical characteristics, said drain bias supply circuit includes a first drain bias resistor connected between the drain of said first field effect transistor and the voltage source and a second drain bias resistor connected between the drain of said second field effect transistor and the voltage source, the resistance value of said first drain bias resistor and the resistance value of the second drain bias resistor are set at substantially equal values, and the capacitance value of said first capacitor and the capacitance value of the second capacitor are set at substantially equal values.

11. A demodulator as set forth in claim 9, wherein, in said power detector, the ratio Wga/Wgb of the gate width Wga of said first field effect transistor and the gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to substantially equal, the resistance value Ra of said first drain bias resistor and the resistance value Rb of the second drain bias resistor are set so as to satisfy the condition of Ra/Rb=1/N, and the capacitance value of said first capacitor and the capacitance value of the second capacitor are set to substantially equal values.

12. A demodulator, comprising: a first signal input terminal to which a first high frequency signal is input, a second signal input terminal to which a second high frequency signal is input, a generating means for generating two high frequency signals having a phase difference based on at least one high frequency signal between the first high frequency signal input from said first signal input terminal and the second high frequency signal input from said second signal input terminal and including at least one output terminal for outputting the generated high frequency signals, at least one power detector for receiving as input the high frequency signals output from the output terminal of said generating means and detecting the signal level of the input high frequency signals, and a conversion circuit for converting the output signal of said power detector to a plurality of signal components contained in said first or second high frequency signal, wherein said power detector comprises a first field effect transistor having a gate supplied with said high frequency signal, a second field effect transistor having a source connected to a source of said first field effect transistor, a first gate bias supply circuit for supplying a gate bias voltage to the gate of said first field effect transistor, a second gate bias supply circuit for supplying a gate bias voltage to a gate of said second field effect transistor, a third field effect transistor connected between the connecting point of sources of said first field effect transistor and second field effect transistor and a reference potential, a third gate bias supply circuit for supplying a gate bias voltage to a gate of said third field effect transistor, a drain bias supply circuit for supplying a drain bias voltage to drains of said first field effect transistor and second electric field effect transistor, a first capacitor connected between the drain of said first field effect transistor and a reference potential, and a second capacitor connected between the drain of said second field effect transistor and a reference potential, wherein the voltage difference between the drain voltage of said first field effect transistor and the drain voltage of the second field effect transistor is defined as the detection output.

13. A demodulator as set forth in claim 12, wherein, in said power detector, said first field effect transistor and second field effect transistor have substantially identical characteristics, said drain bias supply circuit includes a first drain bias resistor connected between the drain of said first field effect transistor and the voltage source and a second drain bias resistor connected between the drain of said second field effect transistor and the voltage source, the resistance value of said first drain bias resistor and the resistance value of the second drain bias resistor are set at substantially equal values, and the capacitance value of said first capacitor and the capacitance value of the second capacitor are set at substantially equal values.

14. A demodulator as set forth in claim 12, wherein, in said power detector, the ratio Wga/Wgb of a gate width Wga of said first field effect transistor and a gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to substantially equal, the resistance value Ra of said first drain bias resistor and the resistance value Rb of the second drain bias resistor are set so as to satisfy the condition of Ra/Rb=1/N, and the capacitance value of said first capacitor and the capacitance value of the second capacitor are set to substantially equal values.

15. A demodulator, comprising:

a first signal input terminal to which a first high frequency signal is input, a second signal input terminal to which a second high frequency signal is input, a generating means for generating two high frequency signals having a phase difference based on at least one high frequency signal between the first high frequency signal input from said first signal input terminal and the second high frequency signal input from said second signal input terminal and including at least one output terminal for outputting generated high frequency signals, at least one power detector for receiving as input the high frequency signals output from the output terminal of said generating means and detecting the signal level of the input high frequency signals, and a conversion circuit for converting the output signal of said power detector to a plurality of signal components contained in said first or second high frequency signal, wherein said power detector comprises a first field effect transistor having a gate supplied with said high frequency signal, a second field effect transistor having a source connected to a source of said first field effect transistor, a first gate bias supply circuit for supplying a gate bias voltage to the gate of said first field effect transistor, a second gate bias supply circuit for supplying a gate bias voltage to a gate of said second field effect transistor, a first resistor and a second resistor connected in series between the connecting point of sources of said first field effect transistor and second field effect transistor and a reference potential and having the related connecting point supplied with said high frequency signal, an inductor connected between the connecting point of said first resistor and second resistor and the reference potential, a drain bias supply circuit for supplying a drain bias voltage to drains of said first field effect transistor and second field effect transistor, a first capacitor connected between the drain of said first field effect transistor and a reference potential, and a second capacitor connected between the drain of said second field effect transistor and a reference potential, wherein the voltage difference between the drain voltage of said first field effect transistor and the drain voltage of the second field effect transistor is defined as the detection output.

16. A demodulator as set forth in claim 15, wherein, in said power detector, said first field effect transistor and second field effect transistor have substantially identical characteristics, said drain bias supply circuit includes a first drain bias resistor connected between the drain of said first field effect transistor and the voltage source and a second drain bias resistor connected between the drain of said second field effect transistor and the voltage source, the resistance value of said first drain bias resistor and the resistance value of the second drain bias resistor are set at substantially equal values, and the capacitance value of said first capacitor and the capacitance value of the second capacitor are set at substantially equal values.

17. A demodulator as set forth in claim 15, wherein, in said power detector, the ratio Wga/Wgb of the gate width Wga of said first field effect transistor and the gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to substantially equal, the resistance value Ra of said first drain bias resistor and the resistance value Rb of the second drain bias resistor are set so as to satisfy the condition of Ra/Rb=1/N, and the capacitance value of said first capacitor and the capacitance value of the second capacitor are set to substantially equal values.

18. A demodulator, comprising:

a first signal input terminal to which a first high frequency signal is input, a second signal input terminal to which a second high frequency signal is input, a generating means for generating two high frequency signals having a phase difference based on at least one high frequency signal between the first high frequency signal input from said first signal input terminal and the second high frequency signal input from said second signal input terminal and including at least one output terminal for outputting generated high frequency signals, at least one power detector for receiving as input the high frequency signals output from the output terminal of said generating means and detecting the signal level of the input high frequency signals, and a conversion circuit for converting the output signal of said power detector to a plurality of signal components contained in said first or second high frequency signal, wherein said power detector comprises a first field affect transistor having a gate supplied with said high frequency signal and a source connected to a reference potential, a second field effect transistor having a source connected to a reference potential, a first gate bias supply circuit for supplying a gate bias voltage to the gate of said first field effect transistor, a second gate bias supply circuit for supplying a gate bias voltage to a gate of said second field effect transistor, a drain bias supply circuit for supplying a drain bias voltage to drains of said first field effect transistor and second field effect transistor, a first capacitor connected between the drain of said first field effect transistor and a reference potential, and a second capacitor connected between the drain of said second field effect transistor and a reference potential, wherein the voltage difference between the drain voltage of said first field effect transistor and the drain voltage of said second field effect transistor is defined as the detection output.

19. A demodulator as set forth in claim 18, wherein, in said power detector, said first field effect transistor and second field effect transistor have substantially identical characteristics, said drain bias supply circuit includes a first drain bias resistor connected between the drain of said first field effect transistor and the voltage source and a second drain bias resistor connected between the drain of said second field effect transistor and the voltage source, the first gate bias voltage of said first gate bias supply circuit and the gate bias voltage of said second gate bias supply circuit are set to voltages which are substantially equal to each other and substantially equal to the threshold voltage of said first and second field effect transistors, the resistance value of said first drain bias resistor and the resistance value of the second drain bias resistor are set at substantially equal values, and the capacitance value of said first capacitor and the capacitance value of the second capacitor are set at substantially equal values.

20. A demodulator as set forth in claim 18, wherein, in said power detector, the ratio Wga/Wgb of the gate width Wga of said first field effect transistor and the gate width Wgb of the second field effect transistor is set to N, said drain bias supply circuit includes the first drain bias resistor connected between the drain of said first field effect transistor and the voltage source and the second drain bias resistor connected between the drain of said second field effect transistor and the voltage source, the first gate bias voltage of said first gate bias supply circuit and the second gate bias voltage of the second gate bias supply circuit are set to voltages which are substantially equal to each other and substantially equal to the threshold voltage of said first and second field effect transistors, the resistance value Ra of said first drain bias resistor and the resistance value Rb of the second drain bias resistor are set so as to satisfy the condition of Ra/Rb=1/N, and the capacitance value of said first capacitor and the capacitance value of the second capacitor are set to substantially equal values.

* * * * *

UNITED STATES PATENT AND TRADEMARK OFFICE
CERTIFICATE OF CORRECTION

PATENT NO. : 6,710,716 B1
DATED : March 23, 2004
INVENTOR(S) : Masayoshi Abe et al.

It is certified that error appears in the above-identified patent and that said Letters Patent is hereby corrected as shown below:

Title page,
Item [54], Title, should read:
-- POWER DETECTOR AND DEMODULATOR USING THE SAME --

Signed and Sealed this

Fifth Day of October, 2004

JON W. DUDAS
*Director of the United States Patent and Trademark Office*